US012670305B2

(12) United States Patent (10) Patent No.: US 12,670,305 B2
Etono et al. (45) Date of Patent: Jun. 30, 2026

(54) TESTABILITY CIRCUITRY PLACEMENT WITHIN AN INTEGRATED CIRCUIT DESIGN

(71) Applicant: Synopsys, Inc., Mountain View, CA (US)

(72) Inventors: Farasoa Nathalie Etono, Montbonnot (FR); Rajeev Murgai, Delhi (IN); Daniel Eugenio Durán, Ñuñoa (CL); Manoj Gupta, Rajasthan (IN); Suryanarayana Duggirala, San Jose, CA (US); Menno Ewout Verbeek, Landsmeer (NL); Tihomir Sokcevic, Santiago (CL)

(73) Assignee: Synopsys, Inc., Sunnyvale, CA (US)

( * ) Notice: Subject to any disclaimer, the term of this patent is extended or adjusted under 35 U.S.C. 154(b) by 714 days.

(21) Appl. No.: 18/090,584

(22) Filed: Dec. 29, 2022

(65) Prior Publication Data

US 2023/0205960 A1 Jun. 29, 2023

(30) Foreign Application Priority Data

Dec. 29, 2021 (IN) .............................. 202141061542

(51) Int. Cl.
*G06F 30/333* (2020.01)
*G06F 30/337* (2020.01)

(52) U.S. Cl.
CPC .......... *G06F 30/333* (2020.01); *G06F 30/337* (2020.01)

(58) Field of Classification Search
USPC ....................................................... 716/136
See application file for complete search history.

(56) References Cited

U.S. PATENT DOCUMENTS 11,409,931 B1 * 8/2022 Kaur ..................... G06F 30/333

* cited by examiner

*Primary Examiner* — Bryce M Aisaka
(74) *Attorney, Agent, or Firm* — Patterson + Sheridan, LLP

(57) ABSTRACT

Generating an integrated circuit (IC) includes receiving Design For Testability (DFT) Compressor Decompressor (CODEC) circuitry of an integrated circuit (IC) design, and partitioning the DFT CODEC circuitry into two or more sub-blocks based on a number of scan chains within the IC design. Further, scan chains are assigned to each of the two or more sub-blocks based on locations of end points within the scan chains. A layout of the IC design is generated by placing the DFT CODEC circuitry within the IC design based the locations of end points within the scan chains and the assigned scan chains to each of the two or more sub-blocks.

20 Claims, 20 Drawing Sheets

600

| DESIGN NAME | DESIGN PARAMETERS | DFTMax ULTRA PARAMETERS | AREA PARAMETERS | AREA DEFAULT THRESHOLD=8 | | AREA THRESHOLD=100 | | AREA THRESHOLD=150 | |
|---|---|---|---|---|---|---|---|---|---|
| Design_1 | SI: 5<br>SO: 2<br>int chains:626<br>scan cells:181,255 | Din: 40<br>Sel: 130<br>Dout: 70 | DFT IP ↑<br>Comp ↑<br>Decomp ↑<br>Nb blocks ↑<br>Chains/block → | 46680.66<br>32551.53<br>6156.13<br>16<br>40 | 23.9<br>16.7<br>3.2 | 38389.98<br>24459.33<br>5957.64<br>4<br>157 | 20.6<br>13.1<br>3.2 | 38389.98<br>24459.33<br>5957.64<br>4<br>157 | 20.6<br>13.1<br>3.2 |
| Design_2 | SI: 2<br>SO: 2<br>int chains:444<br>scan cells:127,786 | Din: 38<br>Sel: 107<br>Dout: 112 | DFT IP ↑<br>Comp ↑<br>Decomp ↑<br>Nb blocks ↑<br>Chains/block → | 31715.65<br>21400.96<br>4628.72<br>16<br>28 | 17.7<br>12.0<br>2.6 | 25528.00<br>15103.52<br>4738.51<br>4<br>111 | 14.8<br>8.7<br>2.7 | 24002.38<br>14040.69<br>4275.72<br>2<br>222 | 14.0<br>8.2<br>2.5 |
| Design_3 | SI: 11<br>SO: 5<br>int chains:1,723<br>scan cells:497,896 | Din: 66<br>Sel: 138<br>Dout: 95 | DFT IP ↑<br>Comp ↑<br>Decomp ↑<br>Nb blocks ↑<br>Chains/block → | 94772.08<br>58963.70<br>14070.68<br>16<br>108 | 37.8<br>23.5<br>5.6 | 94772.08<br>58963.70<br>14070.68<br>16<br>108 | 37.8<br>23.5<br>5.6 | 87087.02<br>52323.93<br>13025.39<br>8<br>216 | 35.9<br>21.5<br>5.4 |
| Design_4 | SI: 11<br>SO: 6<br>int chains:3,902<br>scan cells:1,129,963 | Din: 66<br>Sel: 193<br>Dout: 144 | DFT IP ↑<br>Comp ↑<br>Decomp ↑<br>Nb blocks ↑<br>Chains/block → | 239188.39<br>164130.26<br>26147<br>16<br>244 | 58.5<br>40.1<br>6.4 | 239188.39<br>164130.26<br>26147<br>16<br>244 | 58.5<br>40.1<br>6.4 | 239188.39<br>164130.26<br>26147<br>16<br>244 | 58.5<br>40.1<br>6.4 |
| Design_5 | SI: 14<br>SO: 7<br>int chains:5,279<br>scan cells:1,526,908 | Din: 84<br>Sel: 219<br>Dout: 154 | DFT IP ↑<br>Comp ↑<br>Decomp ↑<br>Nb blocks ↑<br>Chains/block → | 310020.86<br>210360.33<br>34220.74<br>16<br>327 | 63.4<br>43.0<br>7.0 | 310020.86<br>210360.33<br>34220.74<br>16<br>327 | 63.4<br>43.0<br>7.0 | 310020.86<br>210360.33<br>34220.74<br>16<br>327 | 63.4<br>43.0<br>7.0 |

TESTABILITY CIRCUITRY PLACEMENT WITHIN AN INTEGRATED CIRCUIT DESIGN

CROSS-REFERENCE TO RELATED APPLICATION

This application claims the priority benefit of Indian Provisional Patent Application Number 202141061542 filed on Dec. 29, 2021, which is incorporated herein by reference in its entirety.

TECHNICAL FIELD

The present disclosure relates to generating a layout of an integrated circuit device.

BACKGROUND

Design For Testability (DFT) circuitry is used in the testing of an integrated circuit (IC) device. To support increasing testability goals and advanced features of the IC device, the size and complexity of the DFT circuitry also increases. The DFT circuitry includes Compressor and Decompressor (DFT CODEC) circuitry. FIG. 1 depicts exemplary DFT circuitry of previous systems. Typically, the DFT CODEC circuitry includes a single, monolithic block (e.g., decompressor circuitry 110) that drives multiple scan chains 120. The scan chains 120 are composed by functional flip flops distributed across the layout of IC device. The locations and connections of the scan chains 120 are not correlated to the corresponding DFT CODEC structure. Accordingly, the locations of the end points of the scan chains 120 are not necessarily proximate to the locations of the decompressor circuitry 110 and/or the compressor circuitry 130. An end point of a scan chain 120 is the first cell or the last cell of the scan chain. For example, both the first and last cells of a scan chain 120 may be referred to as an end point. Accordingly, a placer engine places the DFT CODEC circuitry (e.g., the decompressor circuitry 110 and the compressor circuitry 130) at the center of the corresponding IC device (e.g., chip) layout. Further, to reduce the circuit area and delay of the decompressor circuitry 110, circuitry is shared such that multiple circuit elements are shared among the scan chains 120. However, sharing circuitry increases the routing lengths of the connections between the decompressor circuitry 110 and the scan chains 120, increasing the congestion. Further, the compressor circuitry 130 is typically a single tree structure of XOR logic blocks. The output of the scan chains 120 feeds into the tree of XOR logic blocks. The tree structure is not physically aware, increasing congestion within the IC device.

As the DFT CODEC circuitry uses a large number of connections between the DFT circuitry and the scan chains, the DFT CODEC circuitry negatively impacts congestion within the IC device and degrades Power, Performance and Area (PPA) results for the IC design. Further, the placement of the DFT CODEC circuitry proximate the center of the IC device, further increases the congestion within the IC device.

SUMMARY

In one example, a method of the present disclosure comprises receiving Design For Testability (DFT) Compressor Decompressor (CODEC) circuitry of an integrated circuit (IC) design, and then partitioning, by a processor, the DFT CODEC circuitry into two or more sub-blocks based on a number of scan chains within the IC design. The processor then assigns the scan chains to each of the two or more sub-blocks based on locations of end points within each of the scan chains. Finally, the method generates a layout of the IC design by placing the two or more sub-blocks of the partitioned DFT CODEC circuitry within the IC design based on the locations of end points within the scan chains and the assigned scan chains.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 6 illustrates a table of DFT parameters, according to one or more examples.

DETAILED DESCRIPTION

Aspects of the present disclosure relate to Design For Testability (DFT) circuitry placement within an integrated circuit (IC) design.

In a circuit design, DFT Compressor Decompressor (CODEC) circuitry is typically placed at the center of the layout of the circuit design, increasing the congestion and negatively affecting the power, performance, and area (PPA) of the circuit design. The method disclosed herein allows the placement of the DFT CODEC circuitry to be spread across the IC Device. Accordingly, congestion issues are mitigated within the IC device, and the PPA of the IC device is improved. Further, the length of the traces connected to the DFT CODEC circuitry and functional timing of the DFT CODEC circuitry is improved by reducing the congestion within the corresponding IC design.

Figure 1:
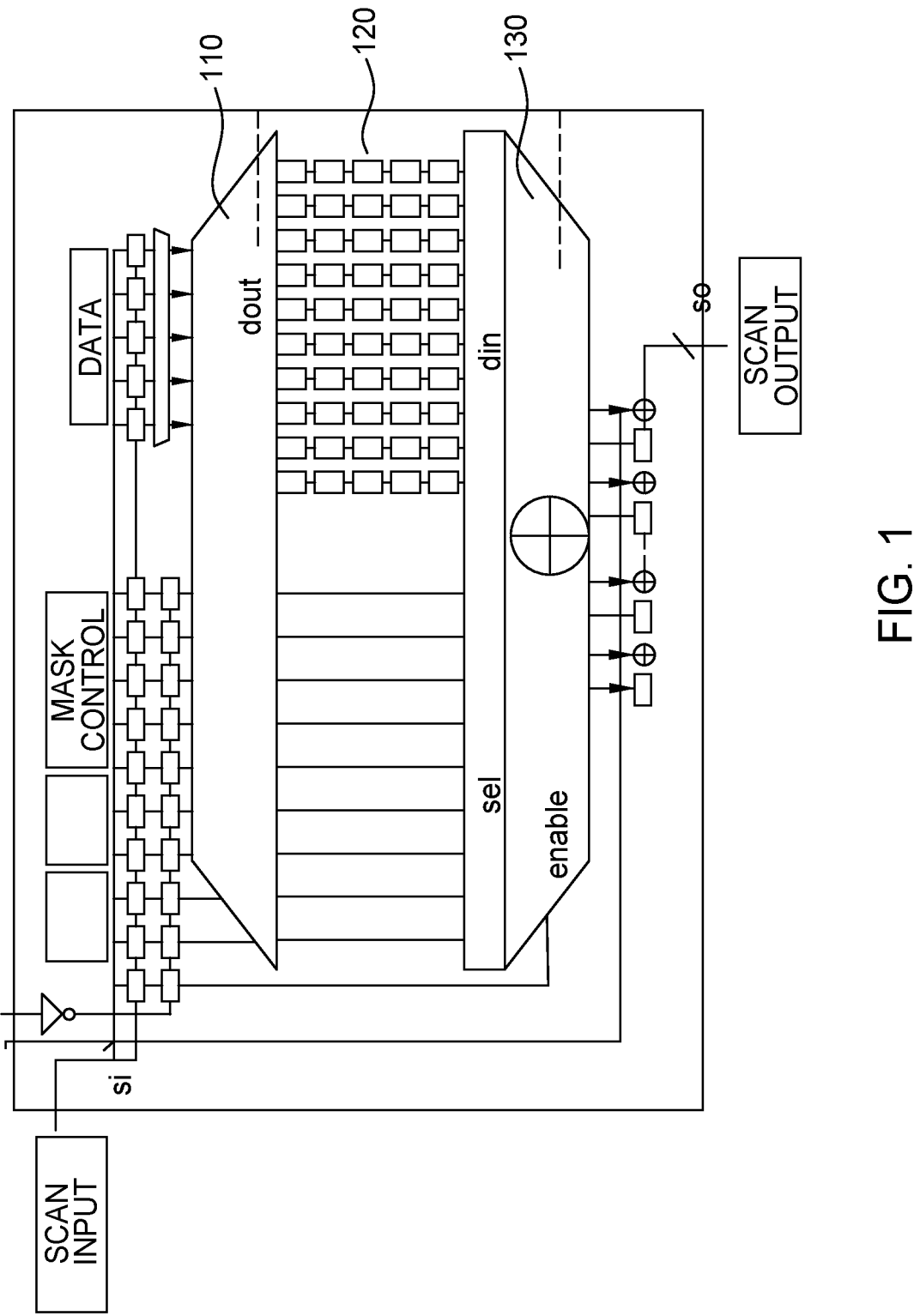
FIG. 1 illustrates example design for testability (DFT) circuitry, according to one or more examples.

Embodiments of the present disclosure utilize a hierarchical XOR tree instead of a monolithic XOR, which allows the CODEC circuitry to be partitioned into blocks of sub CODEC circuitry. Each block of DFT CODEC circuitry can then be spread out in its placement within an IC design, thereby improving the DFT flow and the DFT circuitry topology. Further, placer engines (e.g., Logic Synthesis and Placement engines) take into account the locations of the scan chain end points, improving the placement of the DFT CODEC circuitry. An end point of a scan chain (such as scan chain 120 of FIG. 1) is the first cell or the last cell of the scan chain. For example, both the first and last cells of a scan chain may be referred to as an end point. The placer engine places DFT CODEC circuitry similarly to other functional circuitry. Further, the placer engine places the DFT circuitry based on the locations of the scan chain end points.

Figure 2:
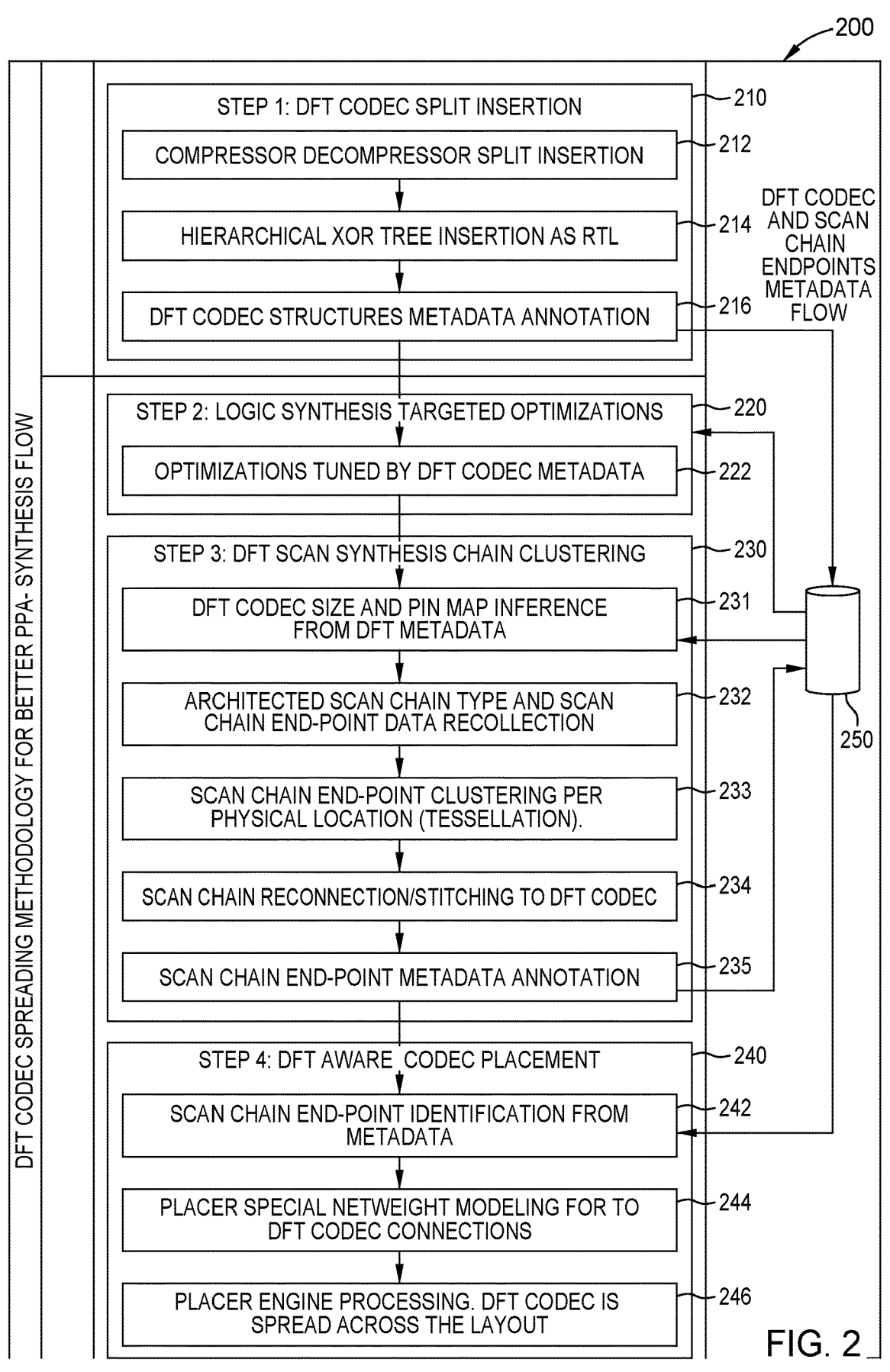
FIG. 2 illustrates a flowchart of a method for determining placement of DFT circuitry, according to one or more examples.

FIG. 2 illustrates a flow chart of a method 200 for determining the placement of, and placing, DFT CODEC circuitry within an IC device. The method 200 may be performed by one or more processors (e.g., the processing device 2002 of FIG. 20) by executing instructions (e.g., the instructions 2026 of FIG. 20) stored in a memory (e.g., the main memory 2004 or the machine-readable medium 2024 of FIG. 20). The method 200 spreads outs the placement of the DFT CODEC circuitry within an IC device by partitioning the DFT CODEC circuitry, and placing the partitions proximate to the corresponding scan chain end points. The partitioning and placement of the DFT CODEC circuitry is linked to the Logic Synthesis, Scan Synthesis, and Physical Design optimization processes of an IC chip design.

Spreading out the placement of the DFT CODEC circuitry within an IC device reduces congestion in the center of the layout of the IC device. Further, spreading out the placement of the DFT CODEC circuitry reduces the overall DFT wire length and improves the overall routing within the IC device, as shorter connections (e.g., traces) are used to connect the DFT CODEC circuitry to the scan chains.

Further, spreading out the DFT CODEC circuitry within an IC device increases the amount of space in the center of an IC device that may be used for routing functional connections, decreasing the length of the routing paths of the functional connections as the routing paths of the functional connects can be routed through the center of IC device instead of being routed around the DFT CODEC circuitry.

The method 200 is composed of four main operations. The four operations include 210, DFT CODE circuitry splitting and annotating, 220, targeted DFT CODEC circuitry area optimization, (Logic Synthesis), 230, scan chains clustering based on the flow annotation, and 240, placement of DFT CODEC circuitry within an IC design.

Operation 210 of FIG. 2 may be performed by an IC device test system or an IC device compiler system. At operation 210, the compressor and decompressor are split at the RTL level, keeping the hierarchy of the sub CODECs. Further, certain information (e.g., flow annotation or metadata) from the splitting is maintained at operation 210, to be provided at later operations of method 200. For example, the metadata may include information regarding the hierarchy of the original CODEC before it is split into sub CODECs, such that each sub CODEC may have metadata regarding its placement within the original CODEC hierarchy. FIG. 2 depicts the DFT CODEC and scan chain end points metadata flow from operation 216 to memory 250.

Operation 210 of the method 200 is depicted in exemplary FIG. 2 as being composed of three operations —212, 214, and 216. At operation 212 of the method 200, DFT CODEC circuitry is divided (e.g., split or partitioned) into multiple blocks, or units. For example, the decompressor and compressor circuitry is divided into multiple sub-blocks. As used herein, a "block" or a "unit" is used to refer to CODEC circuitry, while a "sub-block" or a "sub-unit" is used to refer to one of either decompressor circuitry or compressor circuitry. That is, each CODEC block has two sub-blocks (one for decompressor circuitry and one for compressor circuitry).

At operation 214 of the method 200, the XOR structure (e.g., the XOR circuitry 540 of FIG. 5) is converted to a XOR tree based on the number of the decompressor and compressor sub-blocks generated at operation 212. That is, for a sixteen CODEC block split, a four layer hierarchical XOR tree is generated. For an eight CODEC block split, a two layer hierarchical XOR tree is generated. At operation 216, the DFT CODEC structures metadata annotation is generated and transmitted to memory 250. As discussed herein, this metadata may include information such as a number of blocks that the original CODEC circuitry was split into, placement within the hierarchical XOR tree structure, and scan chain end points. The annotated metadata stored in the memory 250 may further include a XOR tree depth and a XOR stage level of each XOR output pin, as will be discussed further with respect to FIG. 9.

Upon restructure (splitting) of the DFT CODEC in operation 212, addition of hierarchical XOR tree structure in operation 214, and addition of metadata in operation 216, method 200 continues to the second main operation, operation 220, for area optimizations.

Operation 220 of the method 200 may also be performed by an IC device test system or an IC device compiler system. In operation 220, the DFT CODEC circuitry is tuned based on the annotated metadata stored in the memory 250. In a synthesis process, the RTL is mapped to gates of the IC device, generating a footprint area on a chip. In operation 222, the footprint area on the chip is minimized using the DFT CODEC metadata. With the use of the annotated metadata stored in memory, targeted optimizations are conducted for the logic synthesis optimization in operation 220, instead of simply using normal logic, as in prior systems where the metadata annotation was not available. Targeted area optimizations are discussed in further detail below with respect to FIG. 6.

In an exemplary embodiment, at operation 222, optimization methodology is tuned based on the DFT CODEC circuitry and the number of DFT compressor and decompressor sub-blocks. In one example, multiplexer (MUX)-driven optimization is tuned based on the annotated metadata stored in the memory 250. For example, when the DFT compressor/decompressor circuitry is split into multiple sub-blocks, certain MUX optimizations (e.g., MUX partitioning) may have a negative impact on the DFT CODEC circuit area. By using the annotation data (annotated metadata), MUX partitioning may or may not be performed based on the DFT CODEC, improving the PPA of the corresponding IC device.

At operation 230 of method 200 of FIG. 2, DFT scan synthesis chain clustering is conducted. In various embodiments, the operations of operation 230 may be performed by an IC device compiler system. In previous systems, scan chains were stitched without knowledge of the DFT CODEC structure, causing problems with congestion on the IC device. In embodiments of the present disclosure, information regarding the number of sub CODECs generated in operation 210 is transferred to operation 230 to the scan stitching tool, such that clusters of scan chain are created based on each sub CODEC. Further, metadata is added from memory 250 to assist with CODEC placement. Each start and stop cell of each scan chain has a CODEC or sub CODEC identifier as metadata. This metadata assists in placement of the CODECs across the chip, rather than placing all in the middle of the chip, thereby reducing congestion.

At operation 230 of the method 200 of FIG. 2, DFT scan chains are clustered based on the annotated metadata in the memory 250. In one example, operation 230 of the method 200 includes building the scan chains based on the DFT design. The annotated metadata is read, a map between the DFT CODEC interface ports Scan I/O (labeled Dout for decompressor DFT CODEC output that drives a single compressor chain, and Din for a compressor DFT CODEC input driven by a single compressor chain) and the internal sub-block structure is created. An exemplary mapping is shown as the mapping 1000 of FIG. 10.

At operation 231, the DFT CODEC size and pin map is generated from the annotated metadata in the memory 250. In one example, DFT scan insertion determines the identity of each sub-block pair (compressor sub-block and decompressor sub-block), the amount of sub-block structures, and size of each sub-block structure from the annotated metadata. As used herein, size is understood as a number of scan chains going to and from a single compressor/decompressor sub-block structure.

At operation 232, the scan chain types (wrapper chain or internal chain, etc.) for each DFT CODEC connection are determined. Each chain type defines different groups that were architected. Scan chains of the same type are typically grouped together in various embodiments.

At operation 232 of the method 200, the architected scan chains are identified and sorted to the associated scan chain type. The sorted scan chains are stored based on corresponding scan chain types. In one example, the number of scan chains architected by type and the DFT CODEC Din/Dout port types must match.

At operation 233 of the method 200, the end point cells (e.g., first and last cells) of each scan chain are identified along with the mapping to a corresponding scan chain. From each end point cell, the location (e.g., 2-dimensional coordinate) where the scan cell is placed on the IC device is determined.

At operation 234, the end point cells of the scan chains of the same type and corresponding locations are used by a clustering algorithm to create as many clusters as compressor/decompressor sub-block pairs having the type of scan chain. Scan-chains of the same type are clustered together. Further, when the DFT CODEC circuitry is inserted within the IC device design, created scan chain clusters will contain elements (end points) that are physically related such that the scan chain clusters define a clear tessellation (tiling) of the layout of the IC device.

At operation 235, each scan chain cluster is assigned to a sub-block pair that has a corresponding number of the Din/Dout connections. Scan chain stitching connects the corresponding end points of the scan chains to the DFT CODEC interfaces according to the mapping created at operation 231. In one example, metadata is added to the scan chain end point cells and/or first and last component of ScanDEF chains, indicating the sub-block ID the scan chain is connected to. This is discussed in further detail below with respect to FIG. 15. The metadata can be used as guidance for downflow optimizations including, but not limited to, placer engines.

At operation 240 of the method 200, the DFT CODEC circuitry is placed within the layout of a corresponding IC device by a placer engine. The placer engine includes one or more processors (e.g., the processing device 2002 of FIG. 20) that execute instructions (e.g., instructions 2026 of FIG. 20) stored in a memory (e.g., the main memory 2004 or machine-readable medium 2024 of FIG. 20) to place the DFT CODEC circuitry within a layout of an IC design. The placement of the DFT CODEC circuitry is based on the annotated metadata stored within memory 250, and also an output from the scan chain stitching tool from operation 230.

At operation 242 of the method 200, the placer engine obtains the annotated metadata stored within the memory 250, and uses it to identify the scan chain end points. The placer engine reads the annotated metadata generated during operations 210, 220, and 230 of the method 200. For example, the placer engine uses metadata corresponding to the DFT CODEC topology, interfaces, scan chain end point cells, and/or sub-block identifiers among others, to guide the placement operations.

As compared to a conventional placer engine, the placer engine of method 200 uses the annotated metadata to improve the placement of the DFT CODEC circuitry, improving the Quality of Results (QoR) of the IC design. At operation 244, netweight modeling is applied to the DFT CODEC connections, so that the sub CODEC connections will be placed next to each cluster of scan chains, by the placer engine. Typically, the connections to the sub CODEC affect the placement of the sub CODEC, due in part to the connections having a pulling effect on the sub CODEC, as discussed in further detail below with respect to FIG. 17 and FIG. 18. With embodiments of the present disclosure, the sub CODECs are not pulled to the center of the chip; rather, they are pulled outwards and attracted to the scan chain cluster end points. Thus, at operation 244, the metadata is used to influence the placement of the DFT CODEC connections. At operation 246, the placer engine places the sub CODECs across the layout of the chip. The placer engine generates an updated IC design based on the placement of the DFT CODEC circuitry and stores the updated IC design within a memory.

In one example, the placer engine places the DFT CODEC circuitry sub-blocks such that the sub-blocks are separated and placed at various regions of the IC design based on the closest connected scan chain elements. Accordingly, the central region of the IC device may be used for function logic placement, which otherwise would have been split around the DFT CODEC circuitry. Further, the scan chain wire length is reduced as compared to conventional placement methods, since the scan chains are clustered together, and the sub CODECs are placed near end points of the corresponding scan chains.

Figure 3:
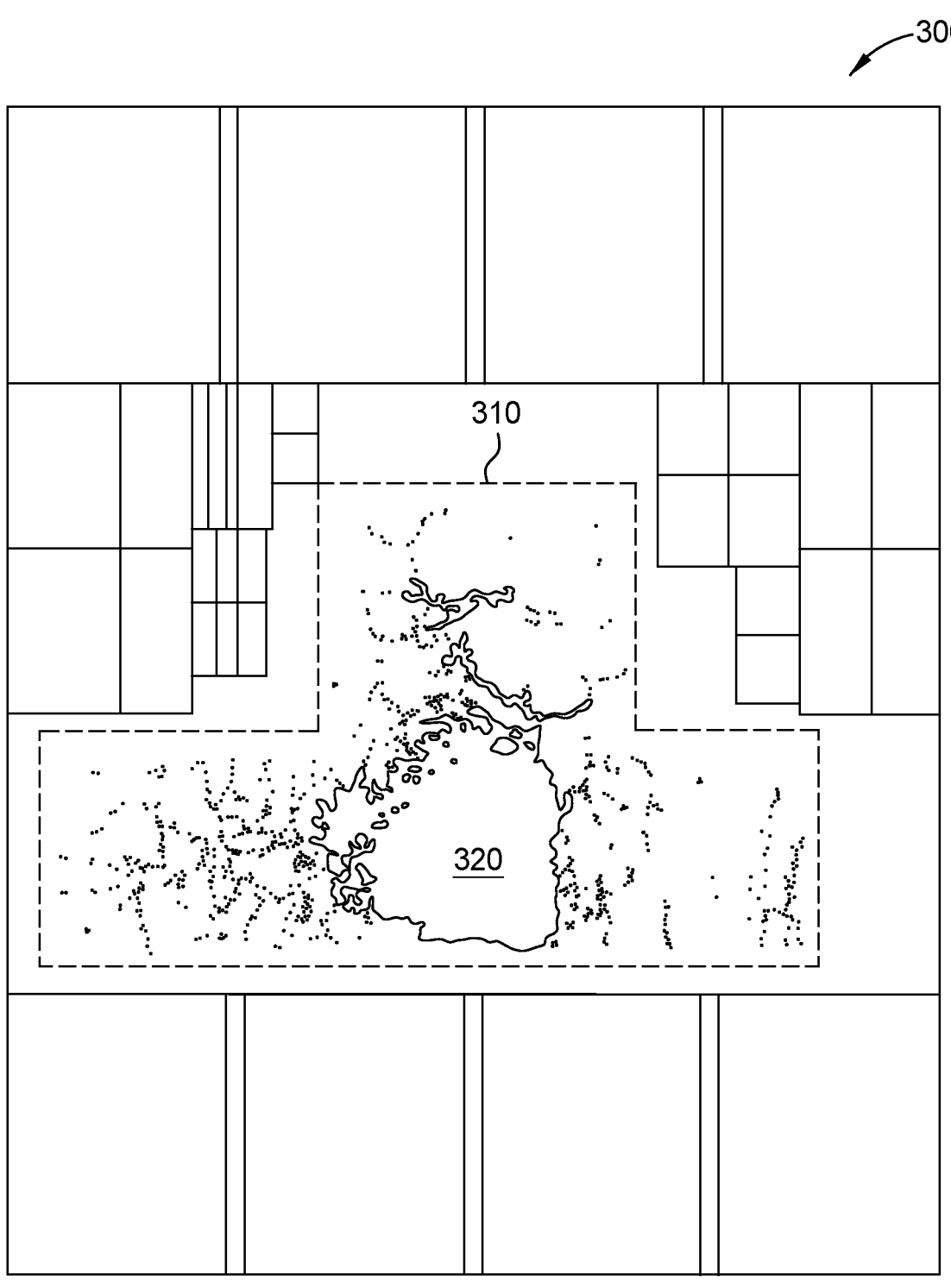
FIG. 3 illustrates location of DFT circuitry of previous systems, according to one or more examples.

FIG. 3 illustrates an exemplary IC device 300 of a typical system, where the placement of DFT CODEC circuitry 320 is located in area 310. As is illustrated by area 310, the majority of the DFT CODEC circuitry 320 is positioned proximate to the center of the IC device 300. That is, the DFT CODEC circuitry 320 is placed around the center of the layout of the IC device 300, in a monolithic clump of circuitry. The DFT CODEC circuitry 320 of FIG. 3 produces 15.13% of overflowing global routing cells (GRCs); that is, GRCs that exceed their routing capacity, 397 k units of area and 13.388 k units of wire length.

Figure 4:
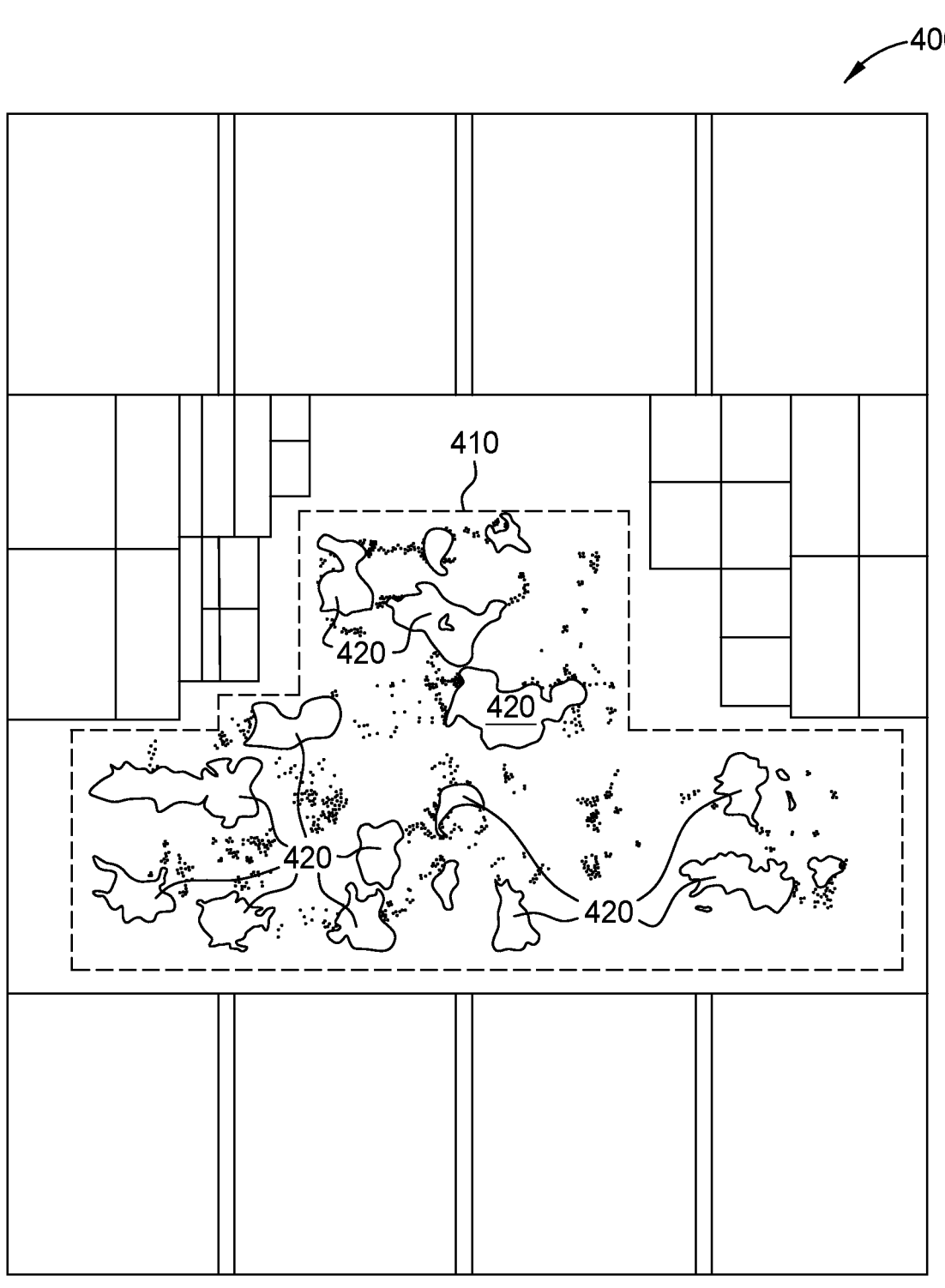
FIG. 4 illustrates location of DFT circuitry of the present disclosure, according to one or more examples.

FIG. 4 illustrates an exemplary embodiment of an IC device 400 of the present disclosure, where the placement of DFT CODEC circuitry 420 is located in area 410. In IC device 400, DFT CODEC circuitry 420 is spread out within smaller clusters in area 410, rather than being primarily in one large cluster, as compared to IC device 300 of FIG. 3.

In the embodiment of FIG. 4, area 410 illustrates that the DFT CODEC circuitry 420 is spread out, e.g., scattered away from the center of the IC device 400, in small sub-blocks. The DFT CODEC circuitry of FIG. 4 has a reduced wire length than that of the DFT CODEC circuitry of FIG. 3. For example, the wire length associated with the DFT CODEC circuitry of FIG. 4 has a reduced wire length of 11.572 k units from that of the DFT CODEC circuitry of FIG. 3, a 14 percent reduction. Further, in the IC device 400 of FIG. 4, the overflowing GRCs are reduced by 6.07% from that of the DFT CODEC circuitry of FIG. 3, and an area that is reduced to 392.6 k units as compared to the DFT CODEC circuitry of FIG. 3 (i.e., a 1.24 percent reduction).

Figure 5:
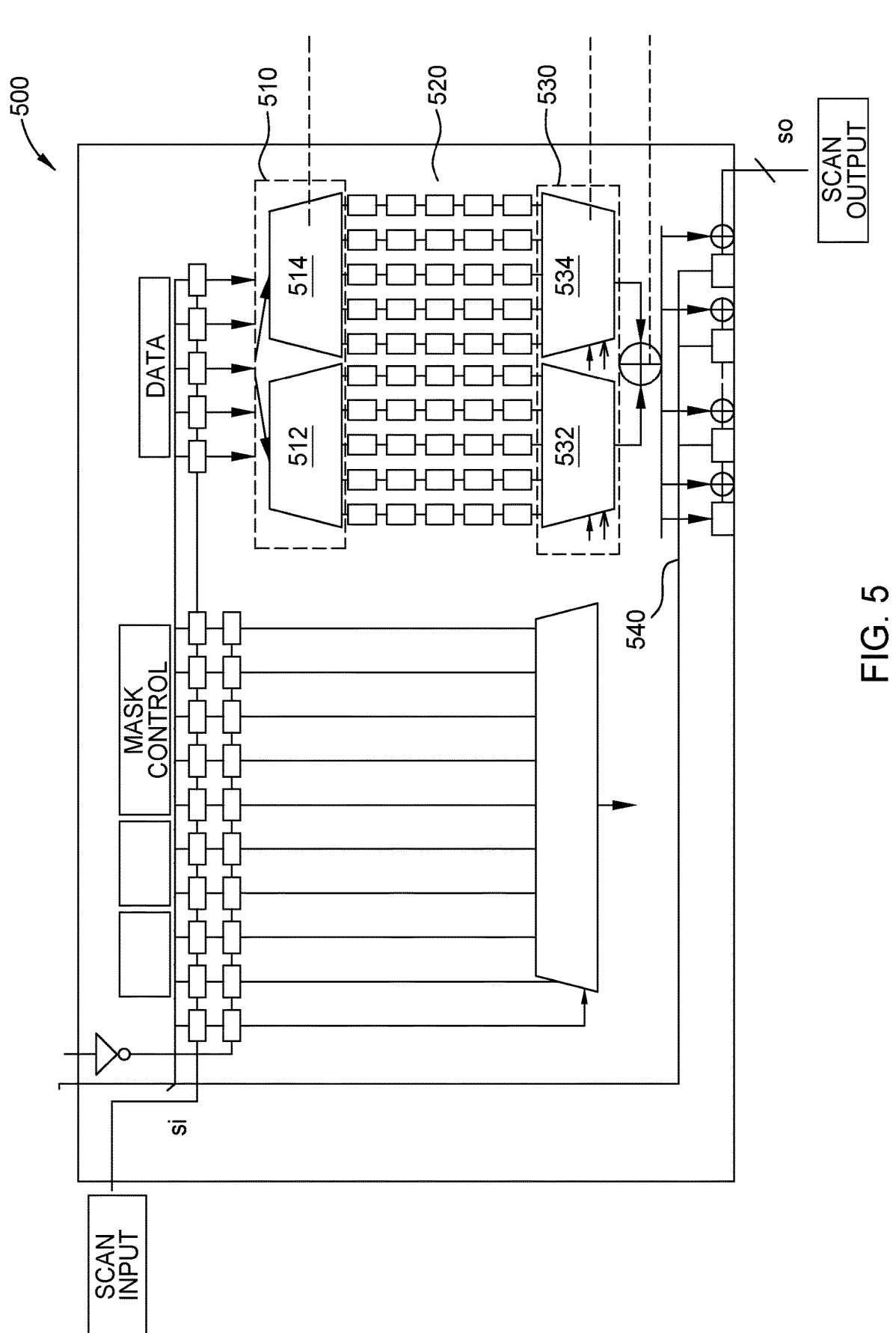
FIG. 5 illustrates example design for testability (DFT) circuitry, according to one or more examples.

FIG. 5 illustrates example DFT circuitry 500, according to one or more embodiments. As illustrated in FIG. 5, decompressor circuitry 510 is divided into decompressor sub-block 512 and decompressor sub-block 514. While FIG. 5 depicts two decompressor sub-blocks for illustration purposes, the number of decompressor sub-blocks may be greater than two in other embodiments. Further, the compressor circuitry 530 is divided into compressor sub-block 532 and compressor sub-block 534. While FIG. 5 depicts two compressor sub-blocks for illustration purposes, the number of compressor sub-blocks may be greater than two in other embodiments. In one example, the number of decompressor sub-blocks in DFT circuitry 500 is equal to the number of compressor sub-blocks.

In various embodiments, the number of decompressor sub-blocks and the compressor sub-blocks are determined based on the number of scan chains in compression mode, and the DFT CODEC circuitry architecture. For example, the architecture of the DFT CODEC circuitry 500 may be based on combinational compressions, low pin count compression solution including some sequential elements, or other DFT compression technologies.

In one example, the decompressor circuitry and the compressor circuitry are divided into sub-blocks based on the number of scan chains 520. The decompressor circuitry and the compressor circuitry are divided into sub-blocks such that each decompressor sub-block and compressor sub-block is associated with (e.g., connected to) about 100 scan chains. In other examples, decompressor circuitry and the compressor circuitry are divided into sub-blocks such that each decompressor sub-block and compressor sub-block is associated with more than or less than 100 scan chains. In one example, each decompressor sub-block and compressor sub-block is associated with the same number of scan chains. In other examples, at least one decompressor sub-block and compressor sub-block pair are associated with a larger number of scan chains than another decompressor sub-block and compressor sub-block pair. In one example, as the decompressor circuitry and the compressor circuitry are divided into sub-blocks, the hierarchies of the decompressor circuitry are maintained (e.g., preserved) within the sub-blocks.

The input of the decompressor sub-blocks 512 and 514 is compressed input data, which is communicated to corresponding ones of the scan chains 520, and then to one or more of compressor sub-blocks 532 and 534. The output of the compressor circuitry 530 is provided to the XOR circuitry 540, which performs a bitwise XOR operation on the outputs of the sub-blocks of the compressor circuitry 530.

The number of decompressor and compressor sub-blocks of the DFT CODEC circuitry may be based on a quality of results (QoR) parameter of an IC design. In one example, the number of decompressor and compressor sub-blocks corresponds to the size of control signals (sel) between the compressor and decompressor circuitry. In one or more examples, there is a trade-off between the DFT CODEC circuitry area overhead and congestion for different numbers of scan chains per sub-block pair. By partitioning compressor circuitry 530 into sub-blocks 532 and 534, and decompressor circuitry 510 into sub-blocks 512 and 514, the amount of physical congestion on the IC device is reduced.

FIG. 6 includes a table 600 that illustrates exemplary design and area parameters for different IC device designs. Table 600 shows exemplary values for an amount of area that is gained based on completion of operation 220 of method 200 of FIG. 2 (area optimization process). Further, table 600 shows that an optimal number of blocks (of sub CODEC circuitry) is sixteen, in various embodiments.

In exemplary Design_1 of table 600, the design parameters are 5 scan in's, 2 scan outs, 626 scan chain, and 181,255 scan chain cells. Further, for this exemplary design, Din=40, and Dout=70, which represent the number of internal registers for this design. The number of select connections ("Sel") is 130. When the CODEC is split into multiple blocks, the amount of physical wire needed to connect the blocks can increase, depending on the number of blocks and their respective placements, which in turn may increase congestion on the chip. In order to obviate this concern, the number of select connections is minimized and tracked for each IC device design.

For an area default threshold of 8, an area of DFT IP is 46680.66 units, which is 23.9% of the area on the IC device. The area of the compressor circuitry is 32551.53 units, which is 16.7% of the area on the IC device. The area of the decompressor circuitry is 6156.13 units, which is 3.2% of the area on the IC device. The number of blocks (i.e., sub CODEC blocks) is 16, and there are 40 chains per block. Since the area of the DFT IP is 23.9%, it is taking up almost a quarter of the space on the IC device, and is thus not an optimal design.

For an area threshold of 100 and an area threshold of 150, of exemplary Design_1, the DFT IP area is 20.6%, which is lower than 23.9%, and thus the more optimal threshold. For this area, 4 CODEC blocks are sufficient to support the 626 scan chains. Thus, the optimal area threshold for Design_1 is area threshold=100, since the area is reduced to an optimal level, and is sufficient to reduce congestion.

For exemplary Design_2, the optimal design is from area threshold=100, where the area of the DFT IP is 14.8% and there are 4 blocks. For exemplary Design_3, the optimal design is from area threshold=150, where the area of the DFT IP is 35.9% and there are 8 blocks. For exemplary Design_4 and Design_5, all variations use a DFT IP area of 63.4% and have 16 blocks. As such, the default area threshold=8 is used.

In exemplary embodiments, an IC device design may have a maximum of 16 blocks. That is, for IC device designs with larger number of scan chains, the maximum of 16 blocks is used, and thus the different design variations depicted in table 600 (for example for Design_4 and Design_5) are less useful. However, for IC device designs with smaller numbers of scan chains (such as Design_1, Design_2, and Design_3), calculations such as those used to generate table 600 can help determine an optimal number of blocks less than 16.

In some embodiments, the maximum number of blocks on an IC device design may be greater than 16. However, increasing the number of blocks increases the area dedicated to the DFT CODEC circuitry on the IC device, and also increases the physical wire connections between the blocks of sub CODECs, thus potentially increasing congestion on the IC device.

Figure 7:
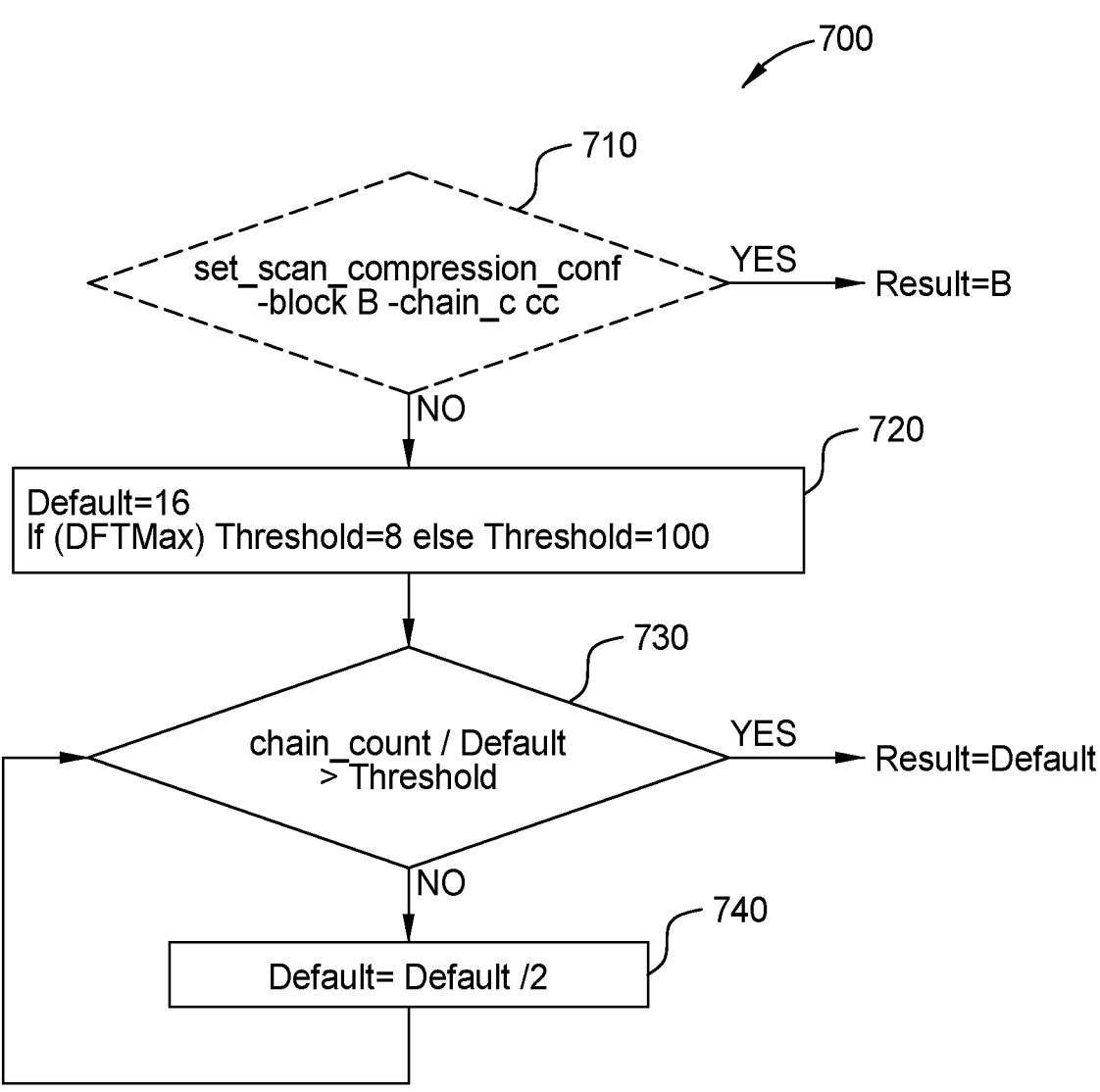
FIG. 7 illustrates a method for determining a number of sub-blocks, according to one or more examples.

FIG. 7 illustrates a flow chart of a method 700 for determining the number of decompressor and compressor sub-blocks. In one embodiment, method 700 is implemented by a computer algorithm. In the method 700, a threshold number of scan chains per block is used to determine the number of blocks. At operation 710 of method 700, DFT setup is evaluated to select the number of blocks defined by a user, if provided. At operation 720 of method 700, a number of blocks is set to a default number, typically either 16 or 8. At operation 720 of FIG. 7, the number of blocks is set to the default number of 16. In other embodiments, this default number of blocks can be set to a value less than 16. If 16 blocks are used in the design (DFTMax), then the area threshold is set to 8. If less than 16 blocks are used in the design, then the area threshold is set to 100. In various embodiments, area thresholds of 8 and 100 correspond to the area thresholds discussed above with respect to table 600 of FIG. 6.

At operation 730, the number of scan chains in the IC design is divided by the default number of blocks from operation 720, to determine a number of scan chains per block. If the number of scan chains per block is greater than the threshold number of scan chains, the number of blocks is set to the default number (from operation 720). If the number of scan chains per block is less than the threshold number of scan chains, the default number is reduced at operation 740. In the exemplary method 700, the default number is divided in half at operation 740. The method then returns to operation 730, where the number of scan chains per block is determined based on the updated default number.

If the number of scan chains per block is greater than the updated default number of blocks, then the updated default number of blocks is used in the IC design. If the number of scan chains per block is still less than the updated default number of blocks, then the default threshold is reduced further at operation 740. The default number of blocks is reduced in an iterative manner until the number of scan chains per block exceeds the threshold number of scan chains.

Figure 8:
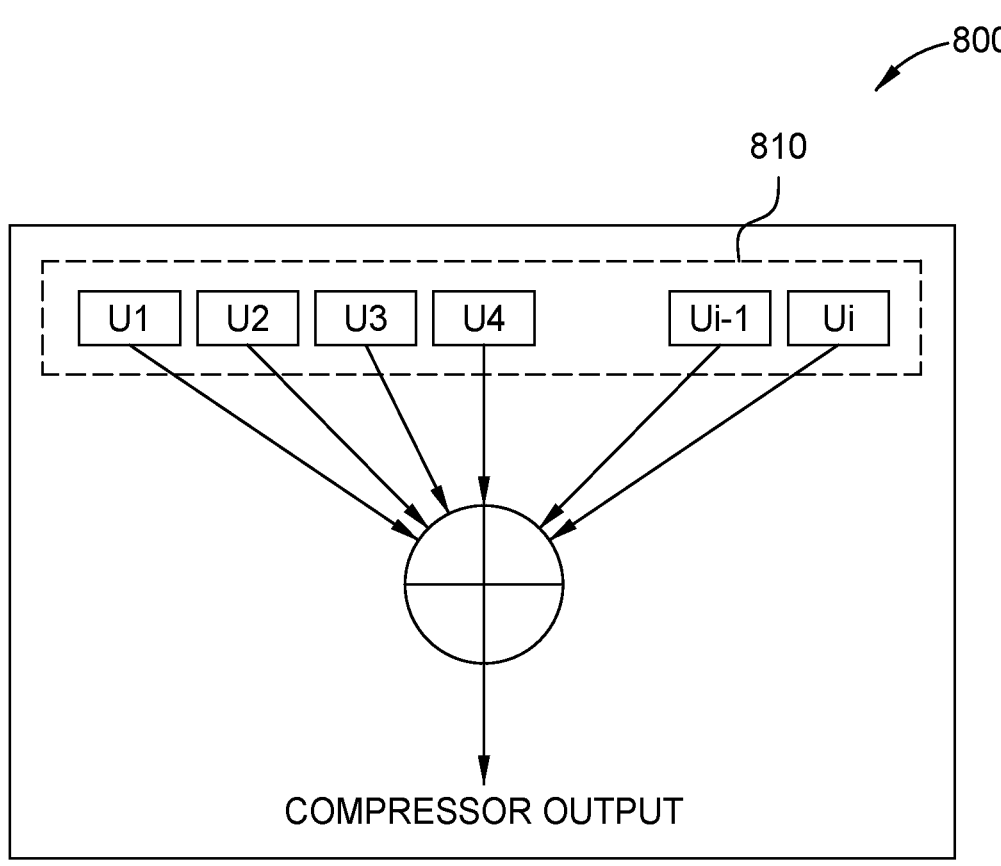
FIG. 8 illustrates example XOR circuitry, according to one or more examples.

FIG. 8 illustrates an example XOR operation 800 performed on the compressor circuitry sub-blocks 810 of previous systems. In example XOR operation 800, the compressor circuitry sub-blocks 810 are linearly placed in comparison to one another, causing one monolithic cluster of compressor circuitry to be placed on an IC device design.

Figure 9:
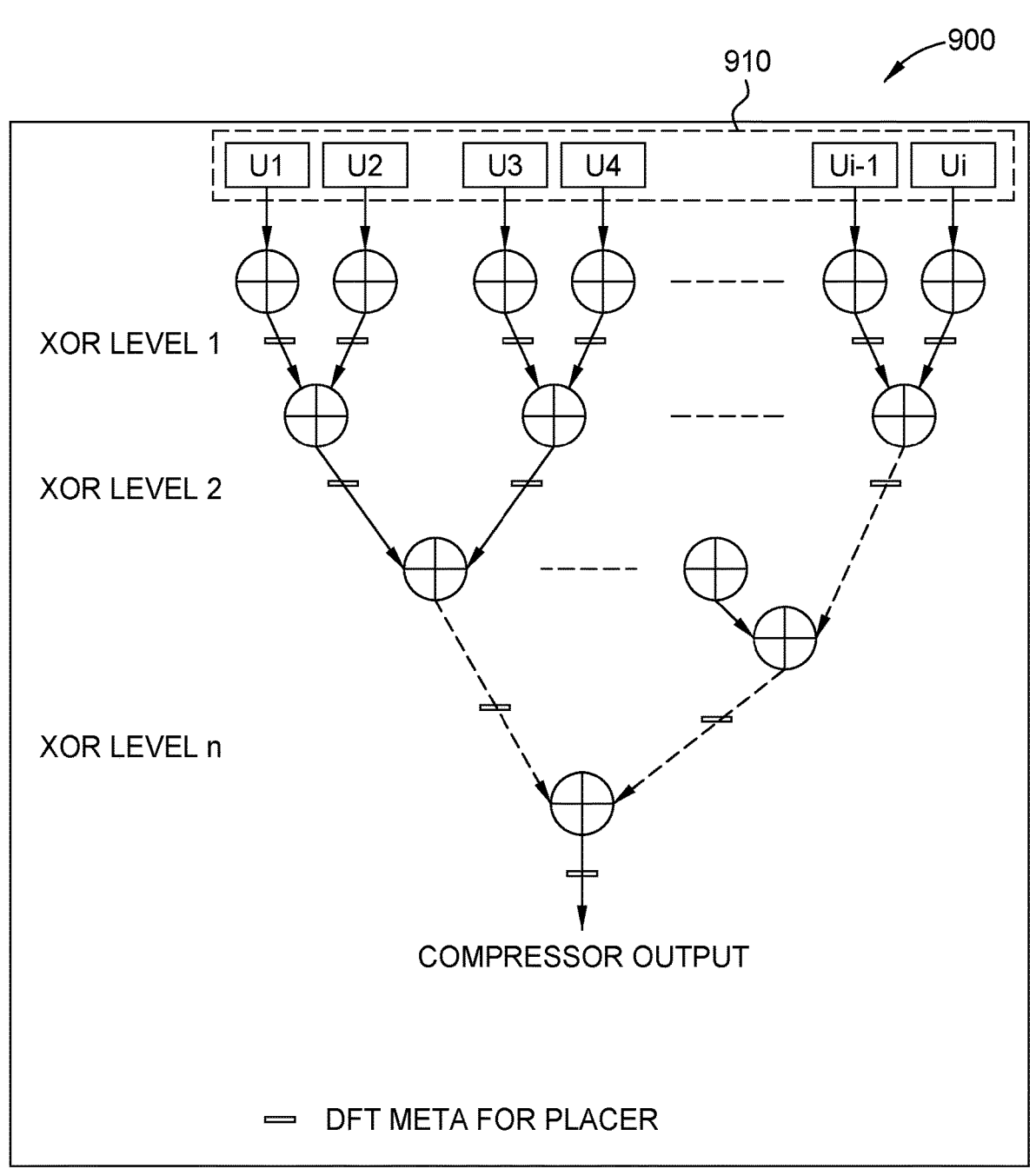
FIG. 9 illustrates example XOR tree circuitry, according to one or more examples.

FIG. 9 illustrates a hierarchical XOR 900, in accordance with embodiments of the present disclosure. Compared to the XOR operation 800 of FIG. 8, in XOR 900 of FIG. 9, an XOR tree is created at the register transfer language (RTL) level, to increase the spreading of the placement of DFT CODEC compressor circuit sub-blocks 910 across an IC design.

The hierarchical XOR 900 is composed of multiple levels of XOR stages. Accordingly, the XOR stages may be partitioned and spread out within the IC device. In one embodiment, there are four XOR levels for an IC device design of 16 compressor sub-blocks.

In some embodiments, metadata annotations are generated based on the hierarchical XOR stages (such as in operation 210 of FIG. 2). This metadata annotation is added at the output of each XOR logic. The metadata annotations may be stored in memory (such as memory 250 of FIG. 2) and used by a placer engine when determining the location of the XOR stages within the IC design (such as in operation 240 of FIG. 2).

In one example, information for the DFT CODEC circuitry is set as a DFT annotation data and stored within the memory 250 of FIG. 2. The DFT annotation data may be used in later operations of the method 200 of FIG. 2. In one example, the annotated data (e.g., annotated metadata) includes a number of DFT CODEC circuitry decompressor and compressor sub-blocks, a subset of scan chain terminals per sub-block, decompressor sub-blocks input pins, compressor sub-blocks control and output pins, and the XOR tree depth. The information regarding the sub-blocks input and output pins is used to map the external terminal connections of the DFT CODEC circuitry to the corresponding sub-block.

Figure 10:
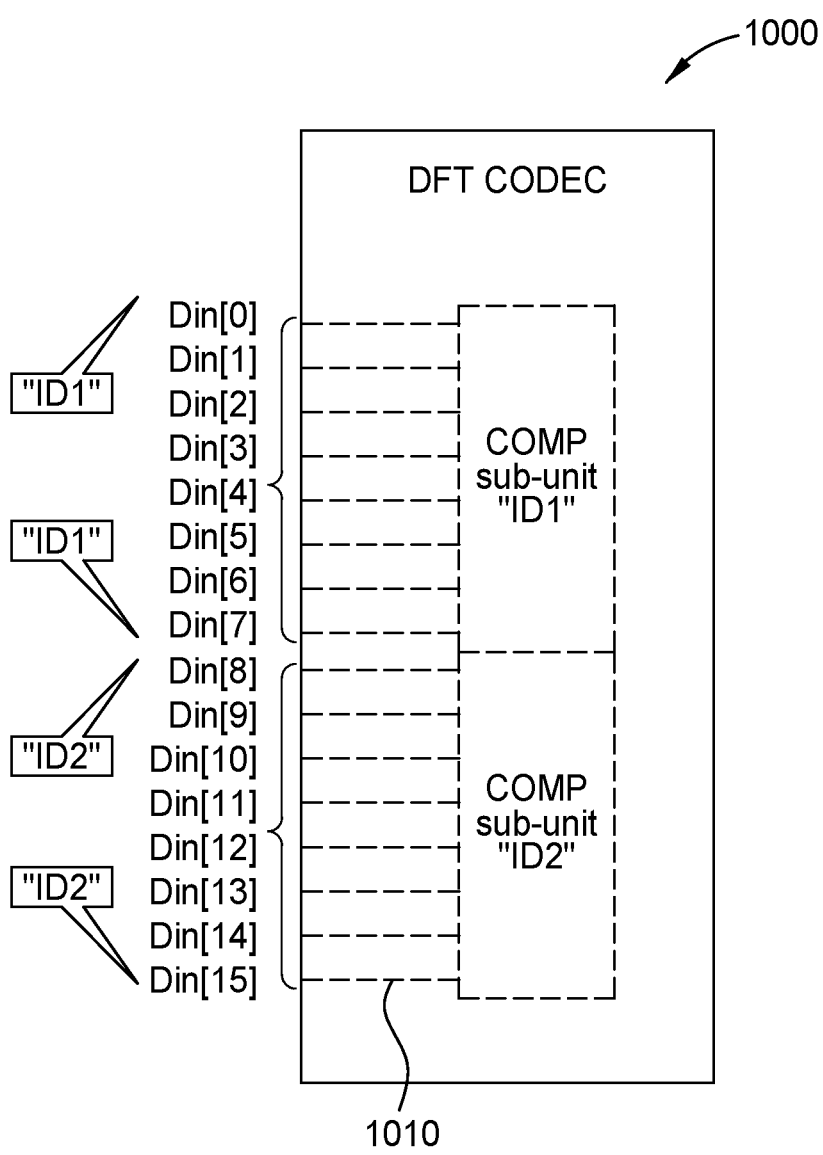
FIG. 10 illustrates sub-block assignments, according to one or more examples.

FIG. 10 illustrates an exemplary mapping 1000 of external pins to compressor sub-blocks (sub-units ID1, ID2). The mapping 1000 includes two sub-blocks. Each sub-block is connected to eight scan chains 1010. Annotated information (metadata) is added by DFT CODEC circuitry insertion to the IC device design, so that each scan chain 1010 can be connected to its corresponding compressor sub-block. In one example, input pins Din[0]-Din[7] are connected to the first sub-block (e.g., the sub-unit ID1) and input pins Din[8]-Din [15] are connected to a second sub-block (e.g., the sub-unit ID2).

While the exemplary mapping 1000 depicts two compressor sub-blocks, there may be additional sub-blocks in other embodiments, as discussed herein. In one example, there can be up to sixteen compressor sub-blocks. Further, while exemplary mapping 1000 depicts eight scan chains connected to each compressor sub-block, there may be more or less scan chains connected to each sub-block in other embodiments. For example, table 600 of FIG. 6 depicts IC device designs with 28-327 scan chains per sub-block. The number of scan chains per sub-block is dependent on the CODEC size.

Figure 11:
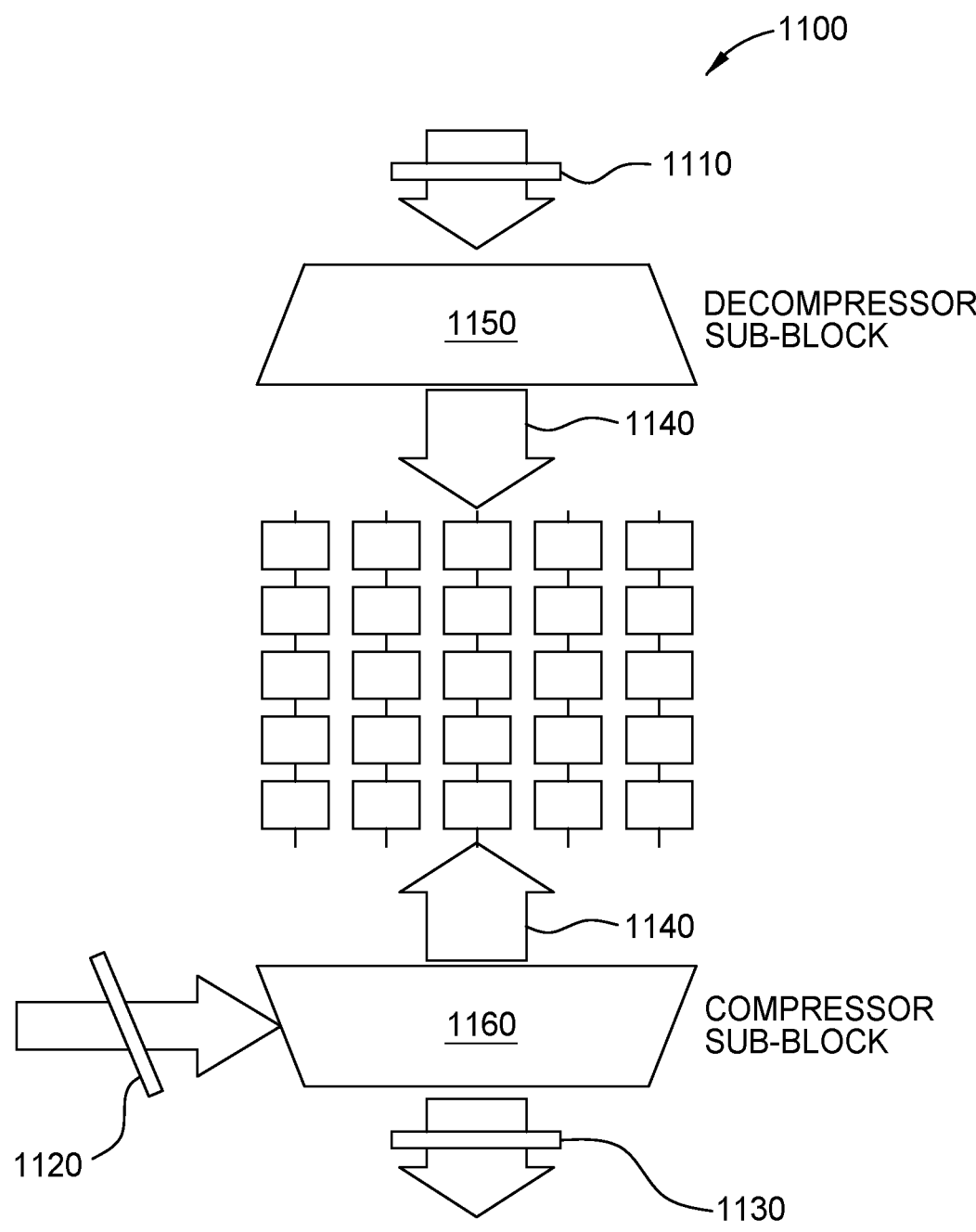
FIG. 11 illustrates example compressor and decompressor circuitry, according to one or more examples.

FIG. 11 illustrates a portion of DFT CODEC circuitry 1100, from the perspective of a placer engine, such as when the placer engine accomplishes operation 240 of FIG. 2 (netweight modeling based on understanding of the metadata). A set of pins and set of nets is identified and modeled to determine an amount of pull inwards towards the cluster that was created by the scan optimization operation of FIG. 2, and an amount of pull outwards, where the outwards pull is trying to keep the blocks together. Arrows 1140 represent the inward pull. The outward pull is not depicted in the exemplary figure.

In FIG. 11, the input pins 1110 are input to the decompressor sub-block 1150. The control pins 1120 and output pins 1130 of the compressor sub-block 1160 are stored in memory (such as memory 250 of FIG. 2) as annotated metadata for the DFT CODEC circuitry 1100.

Figure 12:
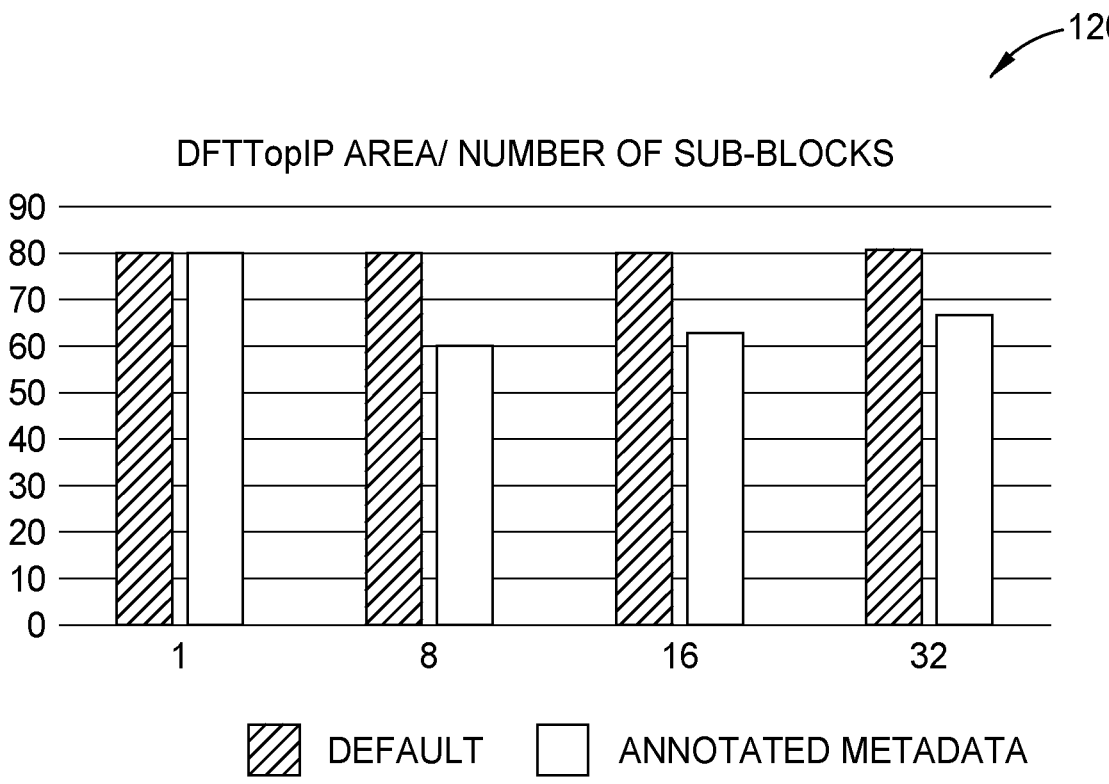
FIG. 12 illustrates a graph comparing the circuit area of different placement techniques, according to one or more examples.

The graph 1200 of FIG. 12 illustrates a comparison of DFT CODEC circuitry area using optimization methodology based on annotated metadata of the present disclosure, compared to conventional optimization methodology (denoted "Default" in FIG. 12). As can be seen, the optimization methodology based on annotated metadata of the present disclosure reduces the circuit area size of the DFT CODEC circuitry as compared to the conventional optimization methodology, for the instances where there eight, sixteen, and thirty-two sub-blocks for the DFT CODEC.

Figure 13:
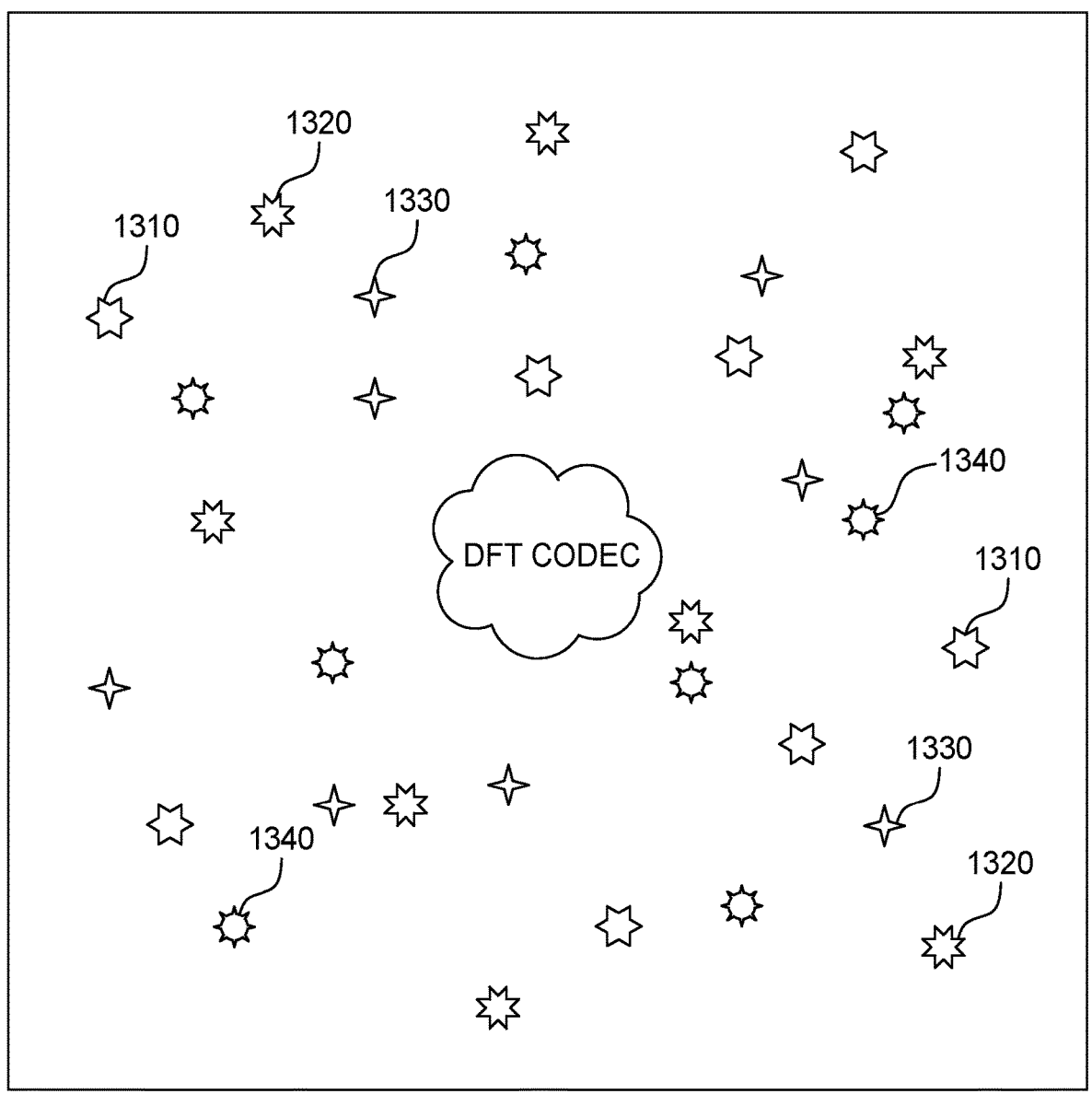
FIG. 13 illustrates an example tessellation based on a random placement of compressor and decompressor circuitry, according to one or more examples.

FIG. 13 illustrates tessellation within an IC device of prior systems (such as IC device 300 of FIG. 3). Each of scan chain end points 1310 are associated with a first sub CODEC identifier, while each of scan chain end points 1320 are associated with a second sub CODEC identifier, each of scan chain end points 1330 are associated with a third sub CODEC identifier, and each of scan chain end points 1340 are associated with a fourth sub CODEC identifier.

However, despite each of scan chain end points 1310 being associated with the same sub CODEC, they are not placed near each other in IC device designs of prior systems. That is, in prior systems, scan chains end points 1310, 1320, 1330, and 1340 are not clustered near one another—they are placed at any point around the chip. As illustrated in FIG. 13, the decompressor and compressor circuitry of the DFT CODEC circuitry are randomly connected to the scan chains. As such, a sub CODEC connected to each of its scan chain end points is pulled in all directions on the chip. Accordingly, the only logical position for the DFT CODEC circuitry is the middle of the chip, since it is the center of mass of all of the scan chain connections. That is, the DFT CODEC circuitry gravitates toward the center of the layout of the IC device.

Figure 14:
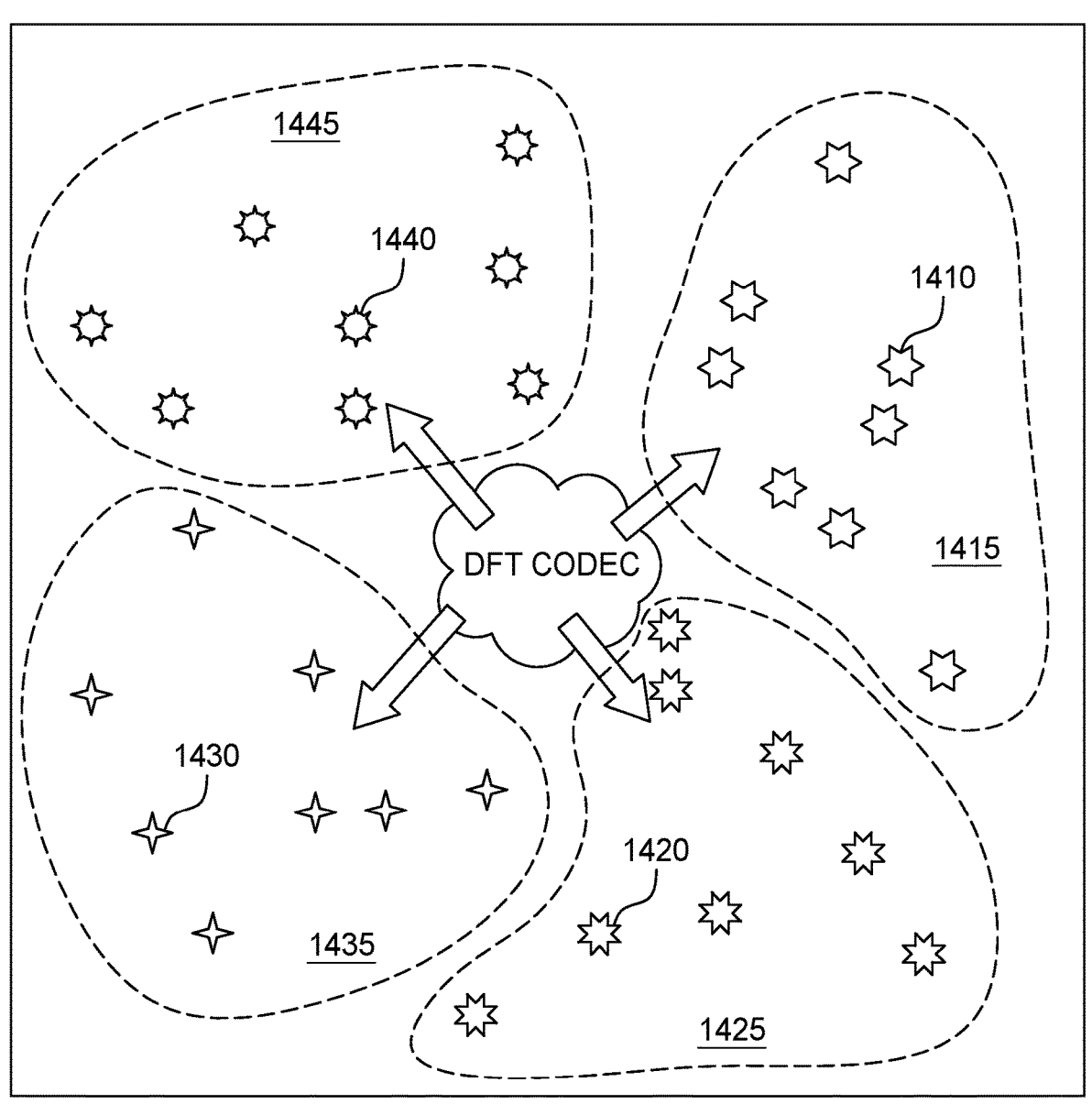
FIG. 14 illustrates an example tessellation based on the placement of compressor and decompressor circuitry as described by the method of FIG. 2, according to one or more examples.

FIG. 14 illustrates a tessellation generated for an IC device, in accordance with embodiments of the present disclosure. In FIG. 14, the scan chain end points 1410, 1420, 1430, and 1440 are re-ordered in their placement on the IC device, such that they each form a cluster. That is, all of scan chain end points 1410 are in area 1415, all of scan chain end points 1420 are in area 1425, all of scan chain end points 1430 are in area 1435, and all of scan chain end points 1440 are in area 1445 of the IC device.

Each sub CODEC may be pulled outwards from the middle of the chip towards its corresponding scan chain end points, based on connecting the scan chains to the decompressor and compressor circuitry based on the location of the end point cells and the clustering of the scan chains. As illustrated in FIG. 14, the DFT codec circuitry may be spread out within the layout of the IC device, as the decompressor and compressor sub-blocks may be positioned closer to the associated scan-chains within the layout of the IC device.

Figure 15:
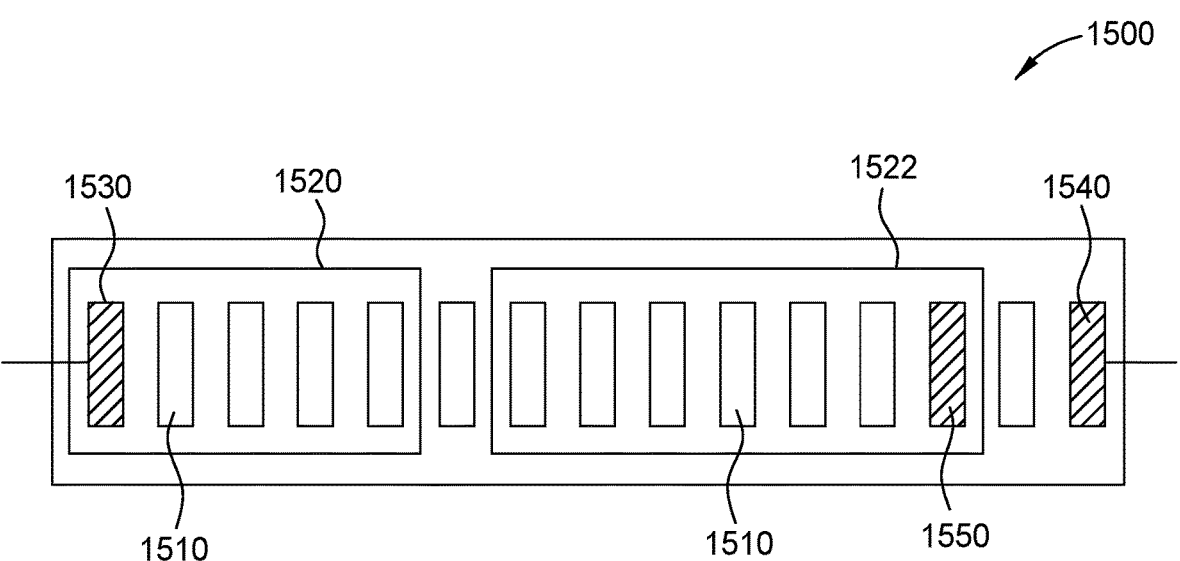
FIG. 15 illustrates an example scan chain, according to one or more examples.

FIG. 15 illustrates a representation of a scan chain 1500 formed by scan cells 1510. The scan chain 1500 includes two ScanDEF chains 1520 and 1522. The first and last cells (e.g., end points) 1530 and 1540 of scan chain 1500, are annotated with metadata information associated with an identifier of a corresponding decompressor compressor sub-block pair. Further, the cells of the ScanDEF chains 1520 and 1522 closest to the first and last cells of scan chain 1500

(i.e., cells 1530 and 1550) are annotated with the corresponding metadata indicating that those cells are ScanDEF cells closest to the end points. With the cell annotations, the placer engine can easily locate the start and end point of scan chain 1500. In one example, the cell 1530 is an end point cell for scan chain 1500, and also a first cell of the ScanDEF chain 1520. Accordingly, the cell 1530 receives both annotations. The annotated metadata is stored within a memory, such as memory 250 of FIG. 2.

Figure 16:
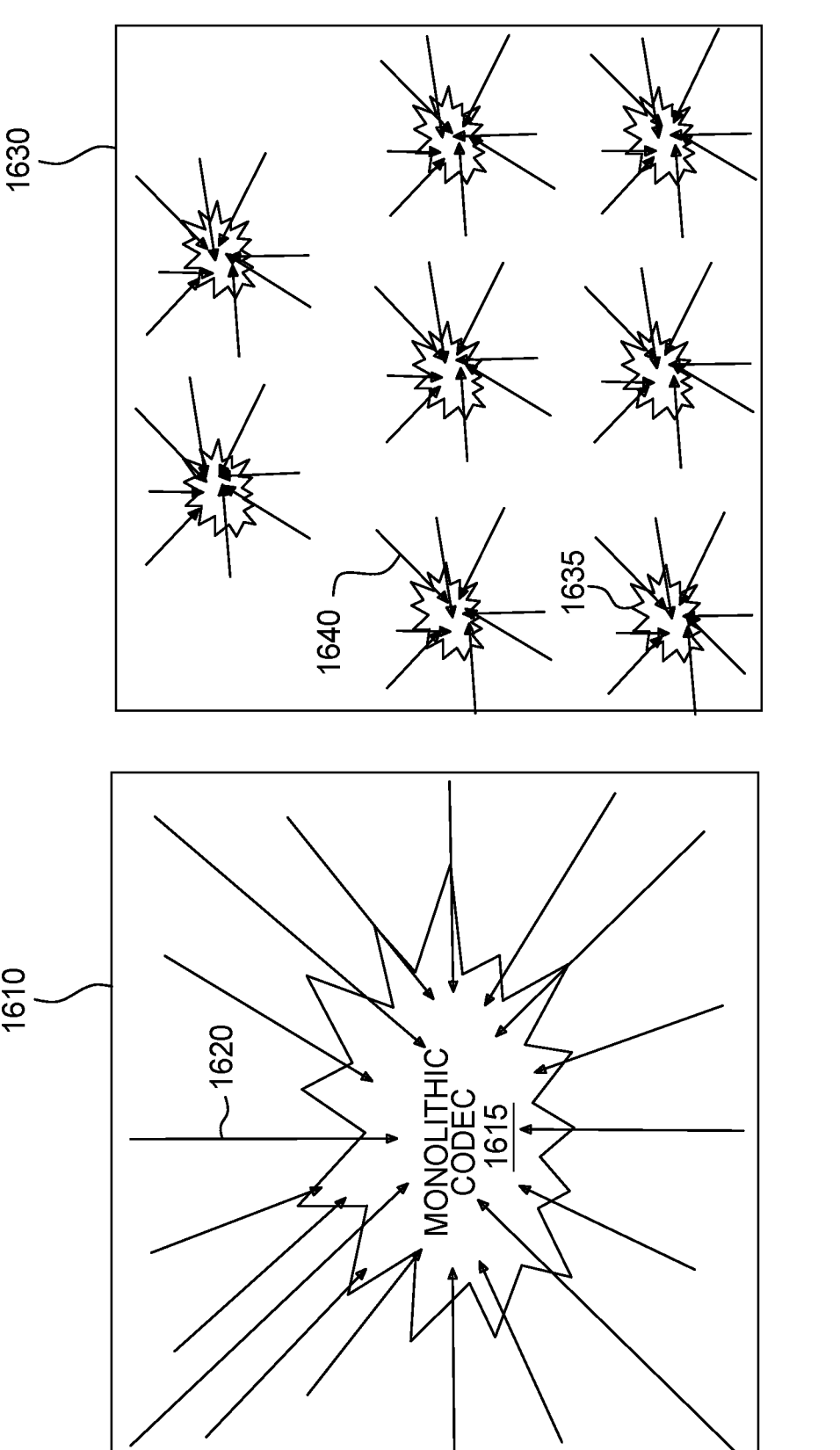
FIG. 16 is an example illustration of monolithic DFT circuitry and spread out DFT circuitry, according to one or more examples.

FIG. 16 illustrates a representation 1610 of prior systems, and a representation 1630 using embodiments of the present disclosure. In representation 1610 of prior systems, the DFT CODEC circuitry is placed as one monolithic CODEC structure 1615 proximate to the center of the IC device. Further, scan chains 1620 pull the monolithic CODEC 1615 towards the center of the IC device, as discussed above with respect to the tessellation of FIG. 13.

In representation 1630 of the present disclosure, the DFT CODEC circuitry is partitioned into multiple blocks of sub CODEC circuitry 1635. Further, the sub CODEC circuitry 1635 is spread out around the IC device. Further, while scan chains 1640 may pull toward the center of a sub CODEC 1635, each sub CODEC remains in its location around the IC device, instead of gravitating towards the middle.

The placer engine controls the placement of end points (e.g., first and/or last cell of a scan chain) of the scan chains identified through metadata. The placement of DFT CODEC circuitry is controlled based on the placement of the end points of the scan chains 1640.

Figure 17:
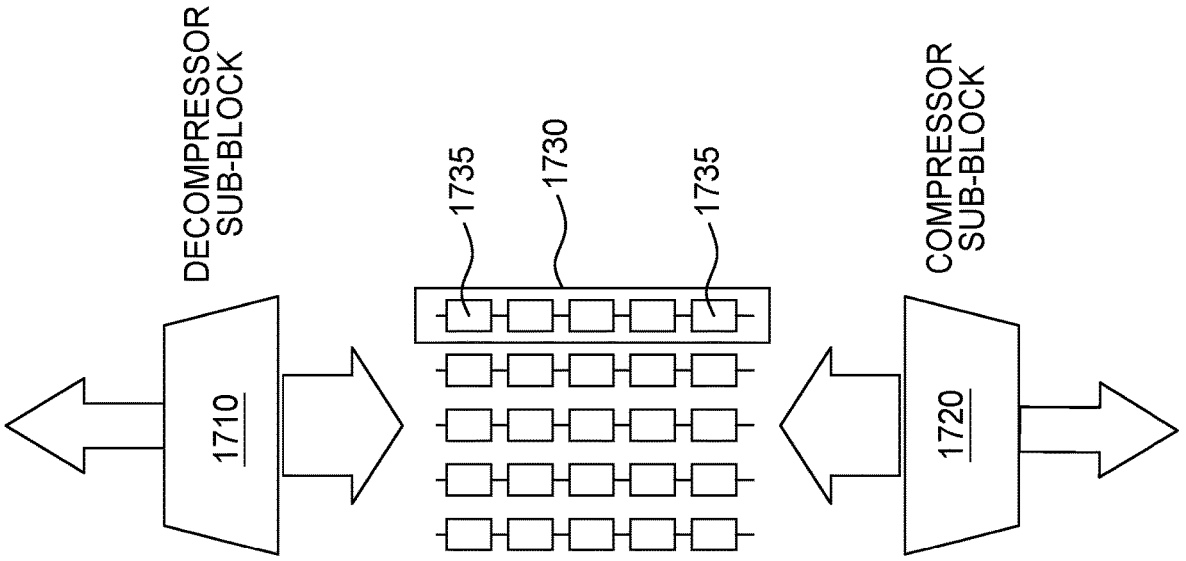
FIG. 17 illustrates example compressor and decompressor circuitry, according to one or more examples.

FIG. 17 illustrates how the placer engine sees the sub-connectivity for each of the sub CODECs. The larger arrows pointing inward from decompressor sub-block 1710 and compressor sub-block 1720, are pointing toward end points 1735 of scan chain 1730. The placer engine places the DFT CODEC circuitry (from decompressor sub-block 1710 and compressor sub-block 1720) such that it is placed proximate to the end points 1735 of the scan chains, pulling the DFT CODEC circuitry toward the end points of the scan chains. The end points 1735 of scan chain 1730 that are to correspond to the decompressor sub-block 1710 and the compressor sub-block 1720 are identified by the placer engine using the stored metadata, as discussed herein. The clustering of scan chain end points creates a directed wire length pull that pulls the DFT CODEC sub-blocks towards the corresponding regions of the IC design and away from the center of the IC design.

The DFT CODEC sub-blocks also have internal connections which attempt to keep the blocks together, and thus pull outwards, away from the scan chain clustered end points 1735, represented by the outward facing smaller arrows of FIG. 17. The information regarding the neighboring blocks is also obtained from the stored metadata. However, since it is desired to keep the blocks in a cluster with their corresponding scan chains 1730, the placer engine models the design with higher weights assigned to the inward pull, represented by the larger arrows facing inward (towards scan chain 1730).

Figure 18:
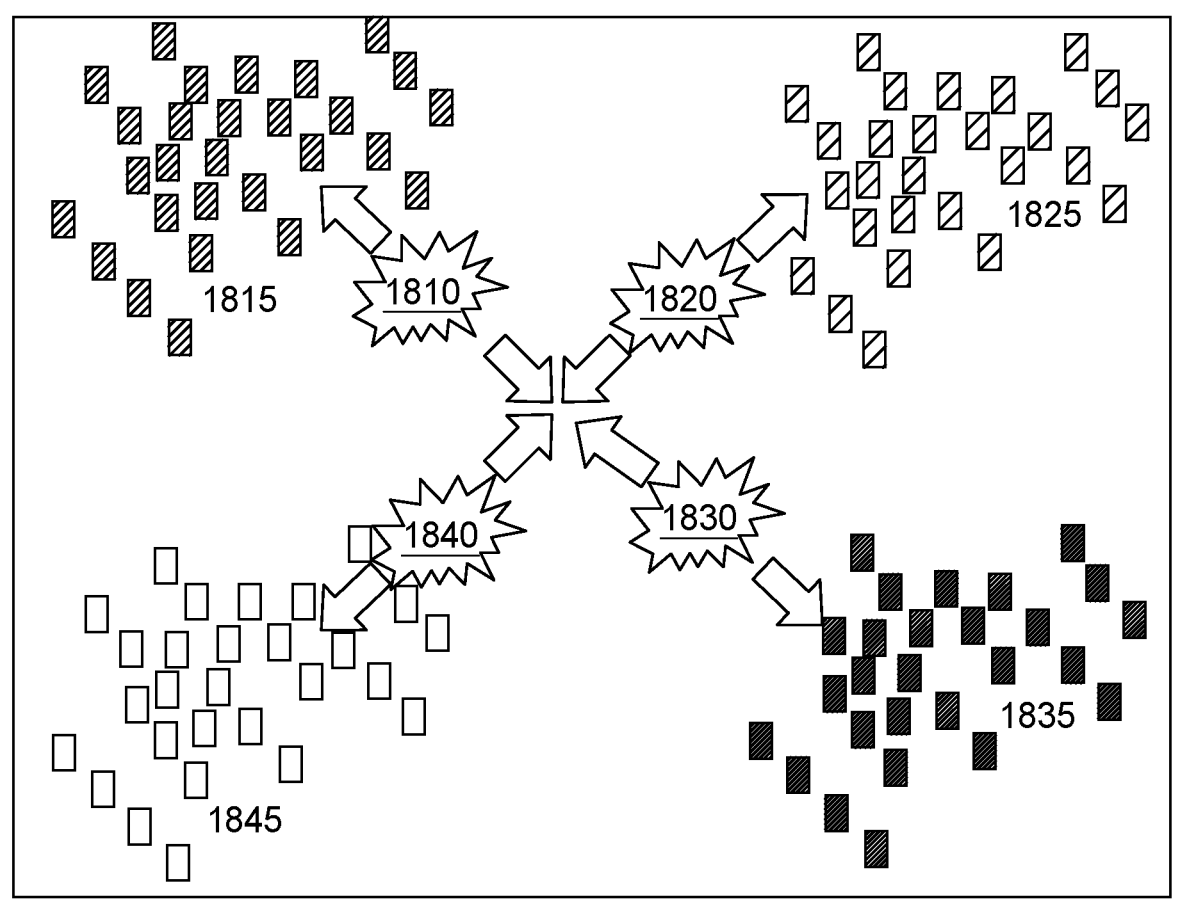
FIG. 18 is an illustration of the placement of DFT circuitry based on the method described herein.

FIG. 18 depicts an exemplary pull between four exemplary blocks or sub CODECs 1810, 1820, 1830, and 1840. As depicted in the exemplary figure, each of the blocks has a stronger pull toward its associated cluster of scan chains—cluster 1815, 1825, 1835, and 1845, as compared to the pull toward the other blocks. The DFT CODEC sub-blocks have internal connections which attempt to keep the blocks together, and external connections which pull the sub-blocks towards the clustered scan chain end points. Based on the metadata, the placer engine identifies the internal connection pull. The intensity of the internal connection pull is modeled so that DFT CODEC sub-blocks are placed proximate the associated scan chains. This modeling is based on scan chain counts, number of sub-blocks and other factors. The placer engine controls the span of spreading by controlling the internal connection modeling. Stronger internal pull will lead to less spreading on the IC device, and vice versa. It is desired to have sufficient enough spreading, but not so much spreading that the wire length is greatly increased. As such, the two factors are balanced in the placer engine modeling.

Figure 19:
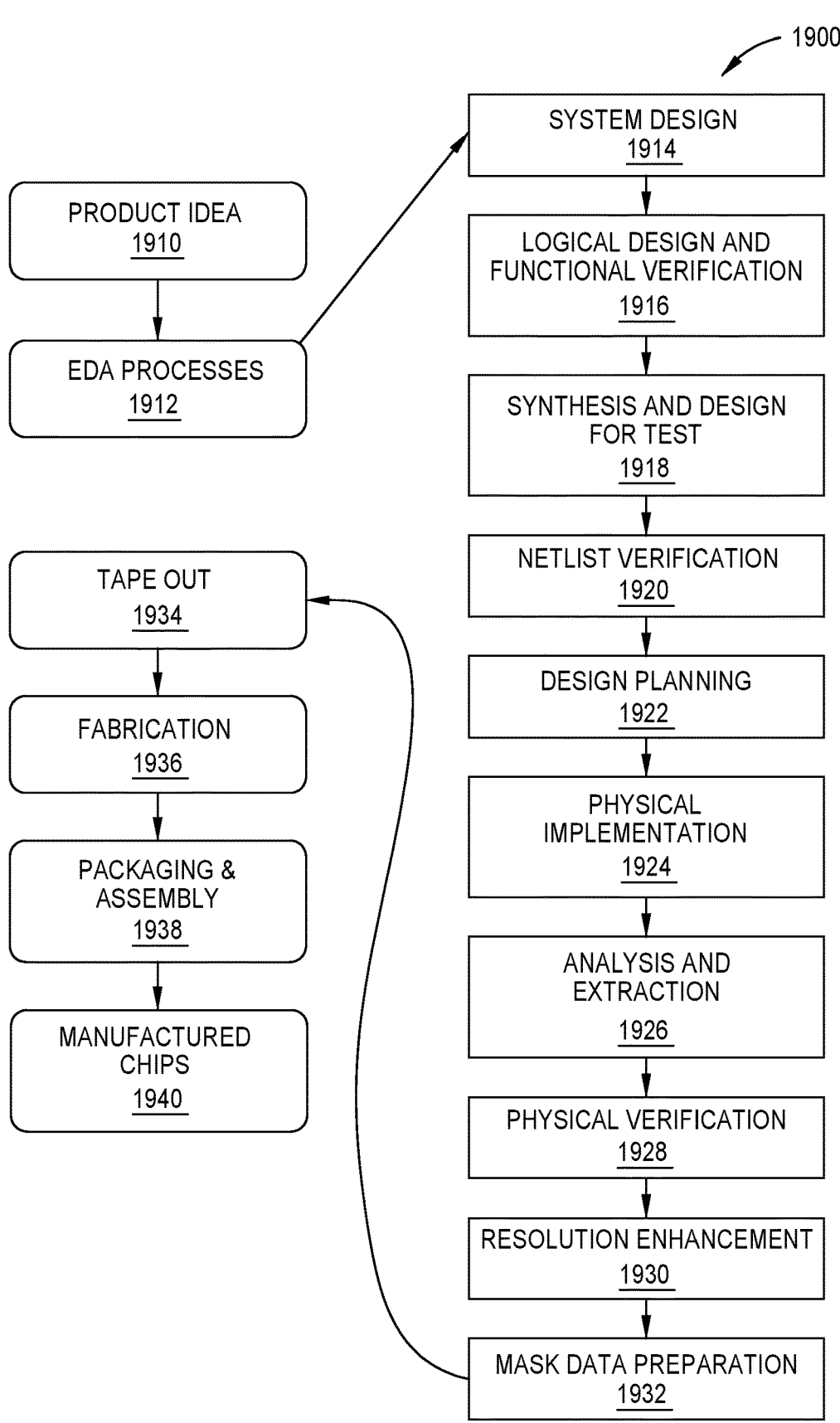
FIG. 19 depicts a flowchart of various processes used during the design and manufacture of an integrated circuit in accordance with some embodiments of the present disclosure.

FIG. 19 illustrates an example set of processes 1900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1910 with information supplied by a designer, information which is transformed to create an article of manufacture that uses a set of EDA processes 1912. When the design is finalized, the design is taped-out 1934, which is when artwork (e.g., geometric patterns) for the integrated circuit is sent to a fabrication facility to manufacture the mask set, which is then used to manufacture the integrated circuit. After tape-out, a semiconductor die is fabricated 1936 and packaging and assembly processes 1938 are performed to produce the finished integrated circuit 1940.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 19. The processes described may be enabled by EDA products (or tools).

During system design 1914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1920, the netlist is checked for compliance with timing constraints and for correspondence with the HDL code. During design planning 1922, an overall floor plan for the integrated circuit is constructed and analyzed for timing and top-level routing.

During layout or physical implementation 1924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1926, the circuit function is verified at the layout level, which permits refinement of the layout design. During physical verification 1928, the layout design is checked to ensure that manufacturing constraints are correct, such as DRC constraints, electrical constraints, lithographic constraints, and that circuitry function matches the HDL design specification. During resolution enhancement 1930, the geometry of the layout is transformed to improve how the circuit design is manufactured.

During tape-out, data is created to be used (after lithographic enhancements are applied if appropriate) for production of lithography masks. During mask data preparation 1932, the 'tape-out' data is used to produce lithography masks that are used to produce finished integrated circuits.

A storage subsystem of a computer system (such as computer system 2000 of FIG. 20) may be used to store the programs and data structures that are used by some or all of the EDA products described herein, and products used for development of cells for the library and for physical and logical design that use the library.

Figure 20:
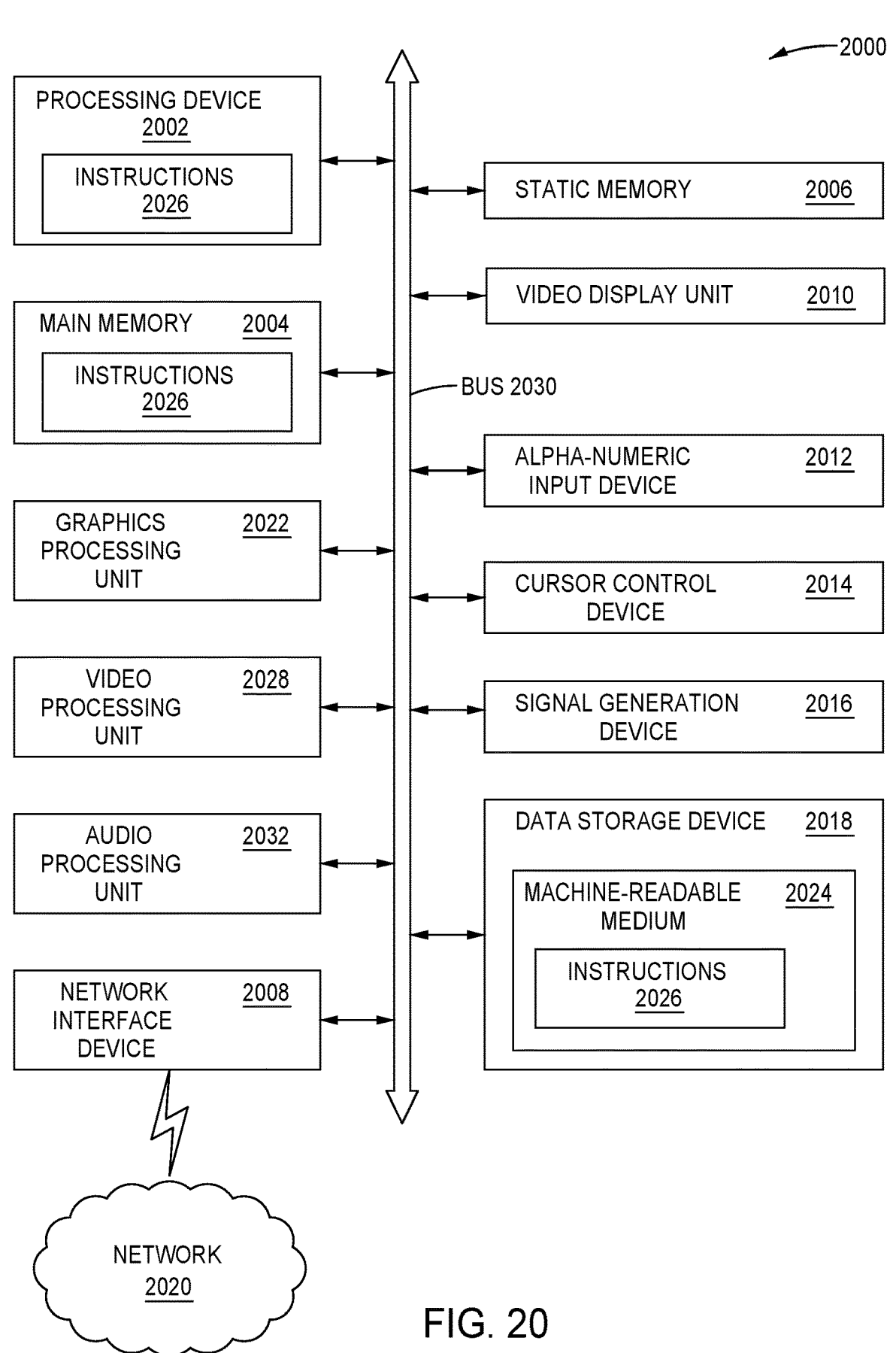
FIG. 20 depicts a representative diagram of an example computer system in which embodiments of the present disclosure may operate.

FIG. 20 illustrates an example machine of a computer system 2000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed)

network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 2000 includes a processing device 2002, a main memory 2004 (e.g., read-only memory (ROM), flash memory, dynamic random access memory (DRAM) such as synchronous DRAM (SDRAM), a static memory 2006 (e.g., flash memory, static random access memory (SRAM), etc.), and a data storage device 2018, which communicate with each other via a bus 2030.

Processing device 2002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 2002 may also be one or more special-purpose processing devices such as an application specific integrated circuit (ASIC), a field programmable gate array (FPGA), a digital signal processor (DSP), network processor, or the like. The processing device 2002 may be configured to execute instructions 2026 for performing the techniques and operations described herein.

The computer system 2000 may further include a network interface device 2008 to communicate over the network 2020. The computer system 2000 also may include a video display unit 2010 (e.g., a liquid crystal display (LCD) or a cathode ray tube (CRT)), an alphanumeric input device 2012 (e.g., a keyboard), a cursor control device 2014 (e.g., a mouse), a graphics processing unit 2022, a signal generation device 2016 (e.g., a speaker), graphics processing unit 2022, video processing unit 2028, and audio processing unit 2032.

The data storage device 2018 may include a machine-readable storage medium 2024 (also known as a non-transitory computer-readable medium) on which is stored one or more sets of instructions 2026 or software embodying any one or more of the methodologies or functions described herein. The instructions 2026 may also reside, completely or at least partially, within the main memory 2004 and/or within the processing device 2002 during execution thereof by the computer system 2000, the main memory 2004 and the processing device 2002 also constituting machine-readable storage media.

In some implementations, the instructions 2026 include instructions to implement functionality corresponding to the present disclosure. While the machine-readable storage medium 2024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 2002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

partitioning, by a processor, a portion of an integrated circuit (IC) design that comprises Design For Testability (DFT) Compressor Decompressor (CODEC) circuitry, into two or more sub-blocks based on a number of scan chains within the IC design;

assigning, by the processor, the scan chains to each of the two or more sub-blocks based on locations of end points within each of the scan chains; and generating a layout of the IC design by placing the two or more sub-blocks of the partitioned DFT CODEC circuitry within the IC design based on the locations of end points within the scan chains and the assigned scan chains.

2. The method of claim 1, further comprising clustering the scan chains based on the locations of the end points, wherein the assigning comprises assigning the scan chains to each of the two or more sub-blocks based on the clustering.

3. The method of claim 1, wherein the clustering comprises clustering the scan chains based on a type, and wherein the assigning comprises assigning the scan chains to each of the two or more sub-blocks based on the clustering.

4. The method of claim 1, wherein the partitioning the DFT CODEC circuitry comprises determining that each of the two or more sub-blocks are associated with a threshold number of scan chains.

5. The method of claim 1, wherein the assigning the scan chains to each of the two or more sub-blocks comprises generating a mapping between the end points and the two or more sub-blocks.

6. The method of claim 1, further comprising tuning multiplexer partitioning based on annotated metadata, wherein the annotated metadata comprises one or more of:

a number of the two or more sub-blocks;

the locations of end points within the scan chains, and the assigned scan chains to each of the two or more sub-blocks.

7. The method of claim 1, wherein the generating the layout of the IC design by placing the DFT CODEC further comprises conducting netweight modeling to determine an acceptable level of pull while maintaining a desired spread of the two or more sub-blocks on the IC design.

8. The method of claim 1, wherein the partitioning comprises partitioning the DFT CODEC circuitry into four, eight, or sixteen pairs of compressor-decompressor sub-blocks.

9. The method of claim 1, wherein the two or more sub-blocks are for decompressor circuitry of the DFT CODEC circuitry.

10. A system, comprising:

a processor; and memory storing instructions that, when executed by the processor cause the processor to:

partition a portion of an integrated circuit (IC) design that comprises Design For Testability (DFT) Compressor Decompressor (CODEC) circuitry, into two or more sub-blocks based on a number of scan chains within the IC design;

assign the scan chains to each of the two or more sub-blocks based on locations of end points within each of the scan chains; and generate a layout of the IC design by placing the two or more sub-blocks of the partitioned DFT CODEC circuitry within the IC design based on the locations of end points within the scan chains and the assigned scan chains.

11. The system of claim 10, wherein the instructions further cause the processor to cluster the scan chains based on the location of the end points, wherein the scan chains are assigned to each of the two or more sub-blocks based on the clustering.

12. The system of claim 10, wherein the instructions further cause the processor to partition the DFT CODEC circuitry into four, eight, or sixteen pairs of compressor-decompressor sub-blocks.

13. The system of claim 10, wherein the instructions further cause the processor to partition the DFT CODEC circuitry by determining that each of the two or more sub-blocks are associated with a threshold number of scan chains.

14. The system of claim 10, wherein the instructions further cause the processor to assign the scan chains to each of the two or more sub-blocks by generating a mapping between the end points and the two or more sub-blocks.

15. A non-transitory computer readable medium comprising stored instructions, which when executed by a processor, cause the processor to:

partition a portion of an integrated circuit (IC) design that comprises Design For Testability (DFT) Compressor Decompressor (CODEC) circuitry, into two or more sub-blocks based on a number of scan chains within the IC design;

assign the scan chains to each of the two or more sub-blocks based on locations of end points within each of the scan chains; and generate a layout of the IC design by placing the two or more sub-blocks of the partitioned DFT CODEC circuitry within the IC design based on the locations of end points within the scan chains and the assigned scan chains.

16. The non-transitory computer readable medium of claim 15, wherein the instructions further cause the processor to cluster the scan chains based on the location of the end points, and to assign the scan chains to each of the two or more sub-blocks based on the clustering.

17. The non-transitory computer readable medium of claim 15, wherein the instructions further cause the processor to cluster the scan chains based on a type, and to assign the scan chains to each of the two or more sub-blocks based on the clustering.

18. The non-transitory computer readable medium of claim 15, wherein the instructions further cause the processor to partition the DFT CODEC circuitry by determining that each of the two or more sub-blocks are associated with a threshold number of scan chains.

19. The non-transitory computer readable medium of claim 15, wherein the instructions further cause the processor to assign the scan chains to each of the two or more sub-blocks by generating a mapping between the end points and the two or more sub-blocks.

20. The non-transitory computer readable medium of claim 15, wherein the instructions further cause the processor to partition the DFT CODEC circuitry into four, eight, or sixteen pairs of compressor-decompressor sub-blocks.

\* \* \* \* \*